United States Patent
Sato et al.

(10) Patent No.: US 6,544,715 B2
(45) Date of Patent: Apr. 8, 2003

(54) POSITIVE PHOTORESIST COMPOSITION FOR FAR ULTRAVIOLET RAY EXPOSURE

(75) Inventors: Kenichiro Sato, Shizuoka (JP); Kunihiko Kodama, Shizuoka (JP); Toshiaki Aoai, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/492,848

(22) Filed: Jan. 27, 2000

(65) Prior Publication Data

US 2002/0098440 A1 Jul. 25, 2002

(30) Foreign Application Priority Data

Jan. 27, 1999 (JP) ............................................ 11-018511

(51) Int. Cl.$^7$ .............................. G03C 1/73; G03F 7/039
(52) U.S. Cl. ................................ 430/270.1; 430/287.1; 430/326; 430/905; 430/910; 430/914
(58) Field of Search ........................... 430/270.1, 287.1, 430/905, 910, 914, 326

(56) References Cited

U.S. PATENT DOCUMENTS

| | | | | |
|---|---|---|---|---|
| 5,817,444 A | * | 10/1998 | Sato et al. | 430/155 |
| 5,968,713 A | * | 10/1999 | Nozaki et al. | 430/326 |
| 6,013,416 A | * | 1/2000 | Nozaki et al. | 430/283.1 |
| 6,060,207 A | * | 5/2000 | Shida et al. | 430/176 |

FOREIGN PATENT DOCUMENTS

| | | | | |
|---|---|---|---|---|
| EP | 0 878 738 A2 | * | 11/1998 | |
| JP | 9-73173 | | 3/1997 | .......... G03F/7/039 |

OTHER PUBLICATIONS

Machine–Assisted English Translation of JP 9–73173 (for Abstract and Examples Section) Provided by Japan Patent Office, Mar. 1997.*

* cited by examiner

Primary Examiner—Janet Baxter
Assistant Examiner—Sim J. Lee
(74) Attorney, Agent, or Firm—Sughrue Mion, PLLC

(57) ABSTRACT

A positive photoresist composition for far ultraviolet ray exposure improved in standard developing solution suitability, good in defocus latitude depended on line pitch of a resist pattern formed and excellent in sensitivity to a light source of shorter wavelength, which comprises (i) a compound capable of generating an acid by irradiation of actinic light or radiation; and (ii) a resin containing (a) repeating units each having an alkali-soluble group protected with at least one specific group containing an alicyclic hydrocarbon structure, (b) repeating units having, for example, lactone rings, and (c) repeating units derived from (meth)acrylic acid, the content of the repeating units of (c) being from 5 mol % to 18 mol % based on the total repeating units of the resin, and the resin being decomposable by action of an acid to increase its solubility in an alkali solution.

15 Claims, No Drawings

POSITIVE PHOTORESIST COMPOSITION FOR FAR ULTRAVIOLET RAY EXPOSURE

FIELD OF THE INVENTION

The present invention relates to a positive type photoresist composition used in an ultramicrolithography process or another photofabrication process for the production of a very large scale integrated circuit or a high capacity microchip, and more particularly to a positive type photoresist composition which can form a highly refined pattern by use of light within the range god of far ultraviolet rays including excimer laser beams, particularly light having a wavelength of 250 nm.

BACKGROUND OF THE INVENTION

In recent years, integrated circuits have been progressively increased in their integration degree, and therefore processing of ultrafine patterns having a line width of a half micron or less has become necessary in the production of semiconductor substrates for very large scale integrated circuits. For fulfilling this necessity, the wavelength of light used in exposure devices employed for photolithography becomes progressively shorter, and now, of the far ultraviolet rays, the use of excimer laser light having a short wavelength (such as XeCl, KrF or ArF) has been studied.

Used in the pattern formation of lithography in this wavelength region are chemical amplification system resists.

In general, the chemical amplification system resists can be roughly divided into three classes, commonly called as a 2-component system, a 2.5-component system and a 3-component system. In the 2-component system, a compound capable of generating an acid by photolysis (hereinafter referred to as a photo-acid generator) is combined with a binder resin. The binder resin is a resin having a group which is decomposable by the action of an acid to enhance the solubility of the resin in analkali developing solution (also referred to as an acid-decomposable group) in its molecule. The 2.5-component system further contains a low molecular weight compound having an acid-decomposable group in addition to such a 2-component system. The 3-component system up contains the photo-acid generator, an alkali-soluble resin and the above-mentioned low molecular weight compound.

The above-mentioned chemical amplification system resists are suitable for photoresists for ultraviolet or far ultraviolet ray irradiation. However, they are further required to comply with desired characteristics when used. For example, when the 248-nm light of a KrF excimer laser is used, resist compositions comprising a hydroxystyrene polymer particularly low in photoabsorption and an acetal group or ketal group is introduced as a protective group into the polymer. Examples thereof are described in JP-A-2-141636 (the term "JP-A" as used herein means an "unexamined published Japanese patent application"), JP-A-2-19847, JP-A-4-219757 and JP-A-5-281745. Besides, similar compositions having t-butoxycarbonyloxy groups or p-tetrahydropyranyloxy groups as acid-decomposable groups are proposed in JP-A-2-209977, JP-A-3-206458 and JP-A-2-19847.

These compositions are suitable when the 248-nm light of a KrF excimer laser is used. However, when an ArF laser is used as a light source, they are low in sensitivity because their absorbance is substantially too high. Accompanied thereby, they further have other disadvantages, for example, the problems of deterioration of resolution, deterioration of focus latitude and deterioration of pattern profiles, so that many improvements are further required.

Accordingly, as the photoresist compositions for the ArF light source, photoresist compositions are proposed in which (meth)acrylic resins smaller in absorption than partially hydroxylated styrene resins are combined with compounds capable of generating acids with light. For example, they are described in JP-A-7-199467 and JP-A-7-252324. Above all, JP-A-6-289615 discloses resins in which each organic group of tertiary carbon is attached though an ester linkage to an oxygen atom of a carboxyl group of acrylic acid.

Further, JP-A-7-234511 discloses acid-decomposable resins having acrylates or fumarates as repeating units. However, the fact is that they are insufficient in pattern profiles and adhesion to substrates, resulting in failure to obtain their sufficient performance.

Furthermore, resins are proposed into which alicyclic hydrocarbon moieties are introduced for imparting the resistance to dry etching. However, the systems become extremely hydrophobic as an adverse effect of the introduction of the alicyclic hydrocarbon moieties. The phenomena are therefore observed that the development with aqueous solutions of tetramethylammonium hydroxide (hereinafter referred to as TMAH) which have hitherto been widely used as resist developing solutions becomes difficult, and that resists are separated from substrates during the development.

For complying with such hydrophobization of resists, a measure of mixing organic solvents such as isopropyl alcohol with the developing solutions has been studied, and results have been observed although not quite satisfactorily. However, there is fear of swelling of resist films, and the process becomes complicated. It is therefore not necessarily said that problems have been solved.

As approaches to the improvement of resists, measures in which hydrophilic groups are introduced to compensate for hydrophobic alicyclic hydrocarbon moieties have been taken.

In general, the measures have been taken by copolymerizing monomers having carboxylic acid moieties such as acrylic acid and methacrylic acid with monomers having alicyclic hydrocarbon groups. However, although there is a tendency of the adhesion to substrates to be improved with the introduction of carboxylic acid groups, many problems occur such as deterioration of the resistance to dry etching and a significant film reduction in resists. Thus, the above-mentioned problems have not been solved yet. Further, JP-A-7-234511 aims at the solution to the problem of development properties by copolymerizing monomers having hydroxyl groups or cyano groups in their molecules in place of carboxyl groups, such as HEMA or acrylonitrile, with monomers having alicyclic hydrocarbon groups, but results thereof are quite insufficient.

On the other hand, in addition to the methods of introducing the alicyclic hydrocarbon moieties into side chains of the above-mentioned acrylate monomers, methods for imparting the resistance to dry etching are also studied in which alicyclic egg hydrocarbon moieties are utilized as main chains of polymers. This system also has the above-mentioned problems, and improvements according to similar approaches have been studied.

For example, in *Journal of Phopolymer Science and Technology*, 10, 529–534 (1997) and *Journal of Photopolymer Science and Technology*, 10, 521–528 (1997), the introduction of hydroxyl groups into main chains of norbornene polymers has been studied from the viewpoint of giving the adhesion to substrates. However, no satisfactory results have been obtained in respect to both the development properties and the adhesion to substrates.

Further, *SPIE*, 3049, 92–105 (1988) discloses compositions containing polymers obtained by ring-opening polymerization of norbornene rings or polymers having norbornene rings on their main chains, which further have carboxyl groups and t-butyl ester groups. However, the polymers obtained by these processes also have the disadvantage that both the adhesion to substrates and the standard developing solution suitability are practically insufficient.

Furthermore, EP-A-789278 discloses compositions containing polymers obtained by ring-opening polymerization of norbornene rings or polymers having norbornene rings on their main chains, which further contain acid-decomposable groups and carboxyl groups. In addition, WO97/33198 discloses photoresist compositions containing resins obtained by polymerizing monomers having norbornene rings having acid-decomposable groups. JP-A-9-274318 discloses photoresist compositions in which carboxylic acids are further used.

Besides, in JP-A-9-73173, JP-A-9-90637 and JP-A-10-161313, resist materials are described in which acid-sensitive compounds containing alkali-soluble groups protected with alicyclic group-containing structures and structure units which are allowed to become alkali-soluble by eliminating the alkali-soluble groups with acids.

As described above, the acid-decomposable group-containing resins used for photoresists for far ultraviolet ray exposure generally contain aliphatic cyclic hydrocarbon groups in their molecules at the same time. Consequently, the resins become hydrophobic, and there are the problems caused thereby. The various means for improving them as described above have been variously studied. However, the above-mentioned processes are still insufficient in many respects, so that the improvements thereof have been desired.

Further, as the recent tendency of devices, various patterns are contained. Accordingly, various performances have been required for resists, and there is the defocus latitude depended on line pitch (dense vias) as one of them. That is to say, devices have portions in which lines aggregate densely, conversely widely spaced patterns, compared with the lines, and further isolated lines. It is therefore important to dissolve various lines with high reproducibility. However, at the present state, the reproduction of various lines is not necessarily easy depending on optical factors, and methods for solving it by resists is not clear. In particular, in the resist system containing the above-mentioned alicyclic groups, the difference in performance between the isolated pattern and the densely aggregated pattern is significant, so that the improvement thereof has been desired.

Furthermore, for the standard developing solution suitability (the characteristic of being developable with 2.38% TMAH as such), the improvement has also been desired.

SUMMARY OF THE INVENTION

It is therefore an object of the present invention to provide a positive type photoresist composition in which the problems of the processes for improving the performances of the above-mentioned microphotofabrication itself using far ultraviolet rays, particularly ArF excimer laser beams, are solved, and specifically, to provide a positive type photoresist composition for far ultraviolet ray exposure improved in standard developing solution suitability, good in defocus latitude depended on line pitch of a resist pattern formed, and moreover, excellent in sensitivity to a light source of shorter wavelength.

The present inventors have intensively studied materials constituting resist compositions in positive type chemical amplification systems. As a result, the present inventors have discovered that the object of the present invention is attained by using specific acid-decomposable resins, thus completing the present invention.

That is to say, the above-mentioned object is attained by the to following constitution:

(1) A positive type photoresist composition for far ultraviolet ray exposure comprising
  (i) a compound capable of generating an acid by irradiation of actinic light or radiation; and
  (ii) a resin containing (a) repeating units each having an alkali-soluble group protected with at least one of groups containing alicyclic hydrocarbon structures represented by the following general formulas (pI) to (pVI), (b) repeating units represented by the following general formula (rI) and (c) repeating units represented by the following general formula (sI), the content of the repeating units of (c) being from 5 mol % to 18 mol % based on the total repeating units of the resin, and the resin being decomposable by action of an acid to increase its solubility in an alkali solution:

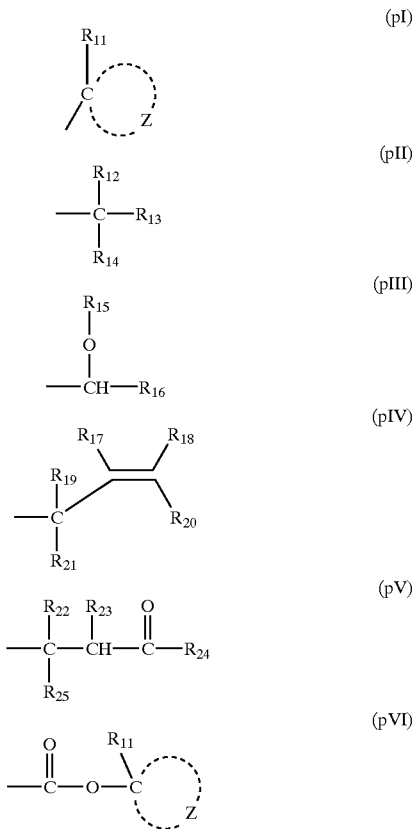

wherein $R_{11}$ represents a methyl group, an ethyl group, a n-propyl group, an isopropyl group, a n-butyl group, an isobutyl group or a sec-butyl group; Z represents an atomic group necessary for formation of an alicyclic hydrocarbon group together with the carbon atom present in formula (pI) or (pVI); $R_{12}$ to $R_{16}$ each independently represents a straight-chain or branched alkyl group having 1 to 4 carbon atoms or an alicyclic hydrocarbon group, with or the proviso that at least one of $R_{12}$ to $R_{14}$ or either of $R_{15}$ and $R_{16}$ represents an alicyclic hydrocarbon group; $R_{17}$ to $R_{21}$ each independently represents a hydrogen atom, a straight-chain or branched alkyl group having 1 to 4 carbon atoms or an alicyclic hydrocarbon group, with the proviso that at least one of $R_{17}$ to $R_{21}$ represents an alicyclic hydrocarbon group, and that either of $R_{19}$ and $R_{21}$ represents a straight-chain or branched alkyl group having 1 to 4 carbon atoms or an alicyclic hydrocarbon group; and $R_{22}$ to $R_{25}$ each independently represents a straight-chain or branched alkyl group having 1 to 4 carbon atoms or an alicyclic hydrocarbon group, with the proviso that at least one of $R_{22}$ to $R_{25}$ represents an alicyclic hydrocarbon group.

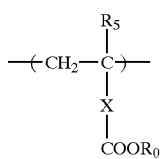

(rI)

wherein $R_5$ represents a hydrogen atom, a halogen atom or a straight-chain or branched alkyl group having 1 to 4 carbon atoms; X represents a divalent connecting group; and $R_0$ represents such a group that a structure represented by $COOR_0$ is decomposable by action of an acid.

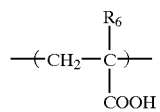

(sI)

wherein $R_6$ represents a hydrogen atom, a halogen atom or a straight-chain or branched alkyl group having 1 to 4 carbon atoms.

(2) The positive photoresist composition described in the above (1), which contains (iii) an amine compound.

(3) The positive photoresist composition described in the above (1) or (2), which contains (iv) a surfactant.

DETAILED DESCRIPTION OF THE INVENTION

The present invention will be described in detail below.
(i) Compound Capable of Generating Acid by Irradiation of Actinic Light or Radiation (Photo-acid Generator)

The photo-acid generator (i) used in the present invention is a compound capable of generating an acid by irradiation of actinic light or radiation.

As the compounds used in the present invention which are decomposable by irradiation of actinic light or radiation to generate acids, photoinitiators for cationic photopolymerization, photoinitiators for radical photopolymerization, photodecoloring agents and photodiscoloring agents for dyes, or compounds capable of generating acids with known light used in microresists (ultraviolet rays of 400 nm to 200 nm, far ultraviolet rays, particularly preferably g-line, h-line, i-line and KrF excimer laser beams), ArF excimer laser beams, electron beams, X-rays, molecular beams or ion beams, and mixtures thereof can be appropriately selected and used.

Other compounds used in the present invention capable of generating acids by irradiation of actinic light or radiation include, for example, onium salts such as diazonium salts described in S. I. Schlesinger, *Photogr. Sci. Eng.*, 18, 387 (1974) and T. S. Bal et al., *Polymer*, 21, 423 (1960), ammonium salts described in U. S. Pat. Nos. 4,069,055, 4,069,056 and Re 27, 992, and JP-A-3-140140, phosphonium salts described in D. C. Necker et al., *Macromolecules*, 17, 2468 (1984), C. S. Wen et al., *Teh. Proc. Conf. Rad. Curing ASIA*, p. 478, Tokyo, October (1988), U.S. Pat. Nos. 4,069,055 and 4,069,056, iodonium salts described in J. V. Crivello et al., *Macromolecules*, 10 (6), 1307 (1977), *Chem. & Eng. News*, Nov. 28, 31 (1988), European Patent 104,143, U.S. Pat. Nos. 339,049 and 410,201, JP-A-2-150848 and JP-A-2-296514, sulfonium salts described in J. V. Crivello et al., *Polymer, J.* 17, 73 (1985), J. V. Crivello et al., *J. Org. Chem.*, 43, 3055 (1978), W. R. Watt et al., *J. Polymer Sci., Polymer Chem. Ed.*, 22, 1789 (1984), J. V. Crivello et al., *Polymer Bull.*, 14, 279 (1985), J. V. Crivello et al., *Macromolecules*, 14 (5), 1141 (1981), J. V. Crivello et al.,*J. Polymer Sci., Polymer Chem. Ed.*, 17, 2877 (1979), European Patents 370,693, 161,811, 410,201, 339,049, 233,567, 297,443 and 297,442, U.S. Pat. Nos. 3,902,114, 4,933,377, 4,760,013, 4,734,444 and 2,833,827, German Patents 2,904, 626, 3,604,580 and 3,604,581, JP-A-7-28237 and JP-A-8-27102, selenonium described in J. V. Crivello et al., *Macromolecules*, 10 (6), 1307 (1977) and J. V. Crivello et al.,*J. Polymer Sci., Polymer Chem. Ed.*, 17, 1047 (1979) and arsonium salts described in C. S. Wen et al., *Teh. Proc. Aim Conf. Rad. Curing ASIA*, p. 478, Tokyo, October (1988); organic halogen compounds described in U.S. Pat. No. 3,905,815, JP-B-46-4605 (the term "JP-B" as used herein means an "examined Japanese patent publication"), JP-A-48-36281, JP-A-55-32070, JP-A-60-239736, JP-A-61-169835, JP-A-61-169837, JP-A-62-58241, JP-A-62-212401, JP-A-63-70243 and JP-A-63-298339, organic metal/organic halides described in K. Meier et al., *J. Rad. Curing*, 13 (4), 26 (1986), T. P. Gill et al., *Inorg. Chem.*, 19, 3007 (1980), D. Astruc, *Acc. Chem. Res.*, 19 (12), 377 (1896) and JP-A-2-161445, photo-acid generators having o-nitrobenzyl type protective groups described in S. Hayase et al., *J. Polymer Sci.*, 25, 753 (1987), E. Reichmanis et al., *J. Polymer Sci., Polymer Chem. Ed.*, 23, 1 (1985), Q. Q. Zhu et al.,*J. Photochem.*, 36, 85, 39, 317 (1987), B. Amit et al., *Tetrahedron Lett.*, (24), 2205 (1973), D. H. R. Barton et al., *J. Chem. Soc.*, 3571 (1965), P. M. Collins et al., *J. Chem. Soc.*, Perkin I, 1695 (1975), M. Rudinstein et al., *Tetrahedron Lett.*, (17), 1445 (1975), J. W. Walker et al., *J. Am. Chem. Soc.*, 110, 7170 (1988), S. C. Busman et al., *J. Imaging Technol.*, 11 (4),191 (1985) H. M. Houlihan et al., *Macromolecules*, 21, 2001 (1988), P. M. Collins et al., *J. Chem. Soc., Chem. Commun.*, 532 (1972), S. Hayase et al., *Macromolecules*, 18, 1799 (1985), E. Reichmanis et al., *J. Electrochem. Soc., Solid State Sci. Technol.*, 130 (6), F. M. Houlihan et al.,*Macromolecules*, 21, 2001 (1988), European Patent 290,750, 046,083, 156,535, 271,851 and 388,343, U.S. Pat. Nos. 3,901,710 and 4,181,531, JP-A-60-198538 and JP-A-53-133022, compounds producing sulfonic acids by photolysis which are represented by iminosulfonates described in M. Tunooka et al., *Polymer Preprints Japan*, 35 (8), G. Berner et al.,*J. Rad. Curing*, 13 (4), W. J. Mijs et al., Coating Technol., 55 (697), 45 (1983), Akzo, H. Adachi et al., Polymer Preprints Japan, 37 (3), European Patent 199, 672, 84,515, 44,115, 618,564 and 101,122, U.S. Pat. Nos. 4,371,605 and 4,431,774, JP-A-64-18143, JP-A-2-245756 and JP-A-3-140109, and disulfone compounds described in JP-A-61-166544 and JP-A-2-71270, and diazoketosulfone and diazodisulfone compounds described in JP-A-3-103854, JP-A-3-103856 and JP-A-4-210960.

Further, compounds in which these groups or compounds capable of generating acids with light are introduced into their main chains or side chains can be used. Examples of such compounds are described in M. E. Woodhouse et al., *J. Am. Chem. Soc.*, 104, 5586 (1982), S. P. Pappas et al., *J. Imaging Sci.*, 30 (5), 218 (1986), S. Kondo et al., *Makromol. Chem., Rapid Commun.*, 9, 625 (1988), Y. Yamada et al., *Makromol. Chem.*, 152, 153, 163 (1972), J. V. Crivello et al., *J. Polymer Sci., Polymer Chem. Ed.*, 17, 3845 (1979), U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029.

Further, compounds capable of generating acids with light can also be used which are described in V. N. R. Pillai Synthesis, (1) 1 (1980), A. Abad et al., *Tetrahedron Lett.*, (47) 4555 (1971), D. H. R. Barton et al., *J. Chem. Soc.*, (C), 329 (1970), U.S. Pat. No. 3,779,778 and European Patent 126,712.

Of the above-mentioned compounds which are decomposable by irradiation of actinic light or radiation to generate acids, is compounds particularly effectively used are described below.

(1) Oxazole derivatives substituted by trihalomethyl groups, which are represented by the following general formula (PAG1), or S-triazine derivatives represented by the following general formula (PGA2):

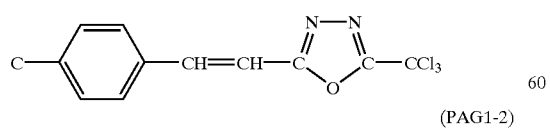
(PAG1)

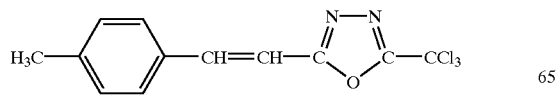
(PGA2)

wherein $R^{201}$ represents a substituted or unsubstituted aryl or alkenyl group; $R^{202}$ represents a substituted or unsubstituted aryl, alkenyl or alkyl group, or $-C(Y)_3$; and Y represents a chlorine atom or a bromine atom.

Specific examples thereof include but are not limited to the following compounds:

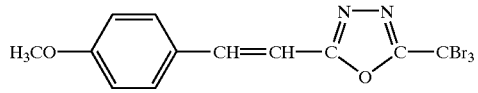
(PAG1-1)

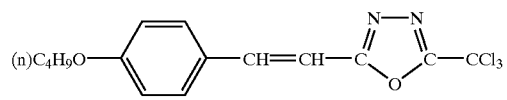
(PAG1-2)

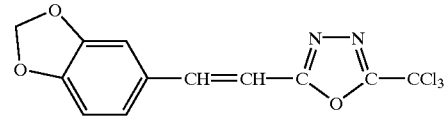
(PAG1-3)

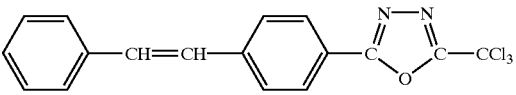
(PAG1-4)

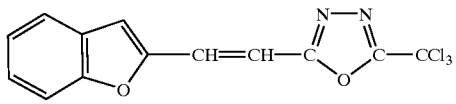
(PAG1-5)

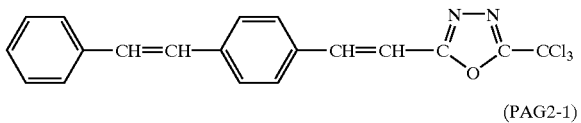
(PAG1-6)

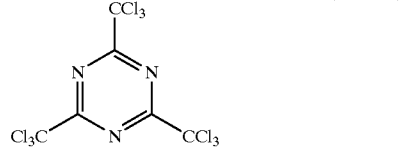
(PAG1-7)

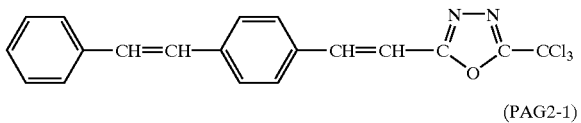
(PAG1-8)

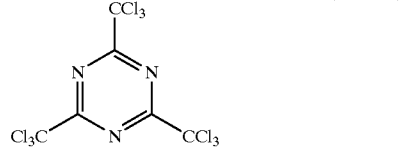
(PAG2-1)

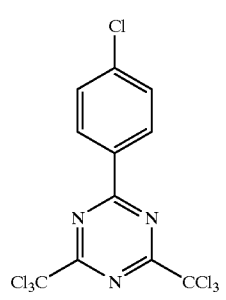
(PAG2-2)

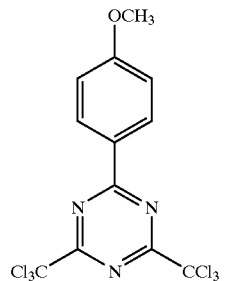
(PAG2-3)

-continued (PAG2-4)
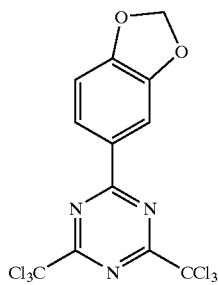

(PAG2-5)
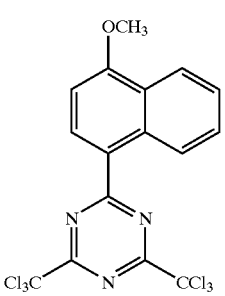

(PAG2-6)
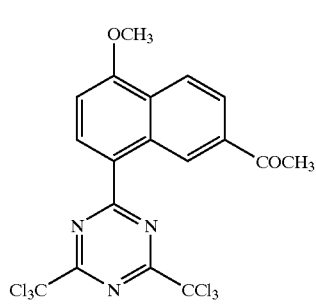

(PAG2-7)
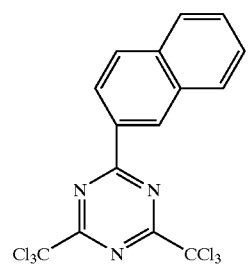

(PAG2-8)
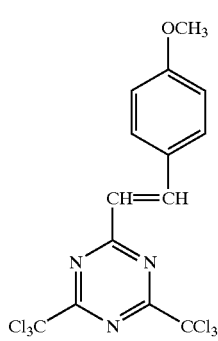

-continued (PAG2-9)
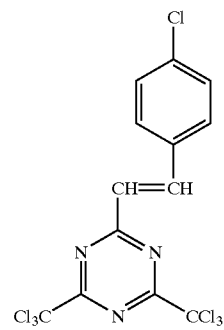

(PAG2-10)
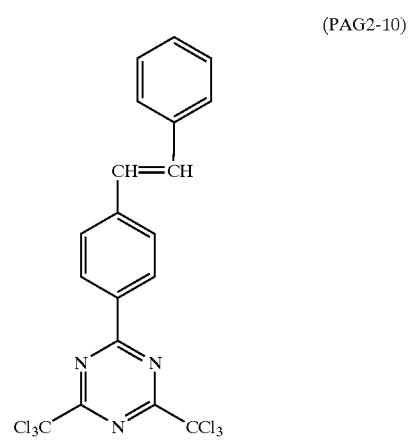

(2) Iodonium salts represented by the following general formula (PAG3) or sulfonium salts represented by the following general formula (PAG4):

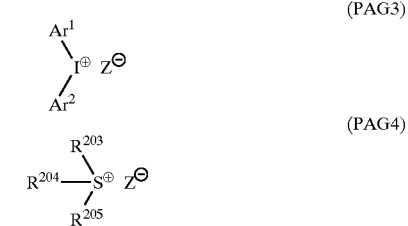

wherein $Ar^1$ and $Ar^2$ each independently represents a substituted or unsubstituted aryl group. Preferred examples of the substitutents include alkyl, haloalkyl, cycloalkyl, aryl, alkoxy, nitro, carboxyl, alkoxycarbonyl, hydroxyl, mercapto and halogen atoms.

$R^{203}$, $R^{204}$ and $R^{205}$ each independently represents a substituted or unsubstituted alkyl or aryl group, and preferably an aryl group having 6 to 14 carbon atoms, an alkyl group having 1 to 8 carbon atoms or a substituted derivative thereof. Preferred examples of the substituents for the aryl group include an alkoxy group having 1 to 8 carbon atoms, an alkyl group having 1 to 8 carbon atoms, nitro, carboxyl, hydroxyl and halogen atoms, and preferred examples thereof for the alkyl group include an alkoxy group having 1 to 8 carbon atoms, carboxyl and alkoxycarbonyl.

$Z^-$ represents a counter anion, and examples thereof include but are not limited to $BF_4^-$, $AsF_6^-$, $PF_6^-$, $SbF_6^-$, $SiF_6^-$, $ClO_4^-$, perfluoroalkanesulfonic acid anions such as $CF_3SO_3^-$, pentafluorobenzenesulfonic acid anions, condensed polynuclear aromatic sulfonic acid anions such as naphthalene-1-sulfonic acid anions, anthraquinonesulfonic acid anions and sulfonic acid group-containing dyes.

Two of $R^{203}$, $R^{204}$, and $R^{205}$, and $Ar_1$ and $Ar_2$ may each combine together through a single bond or a substituent.

Specific examples thereof include but are not limited to the following compounds:

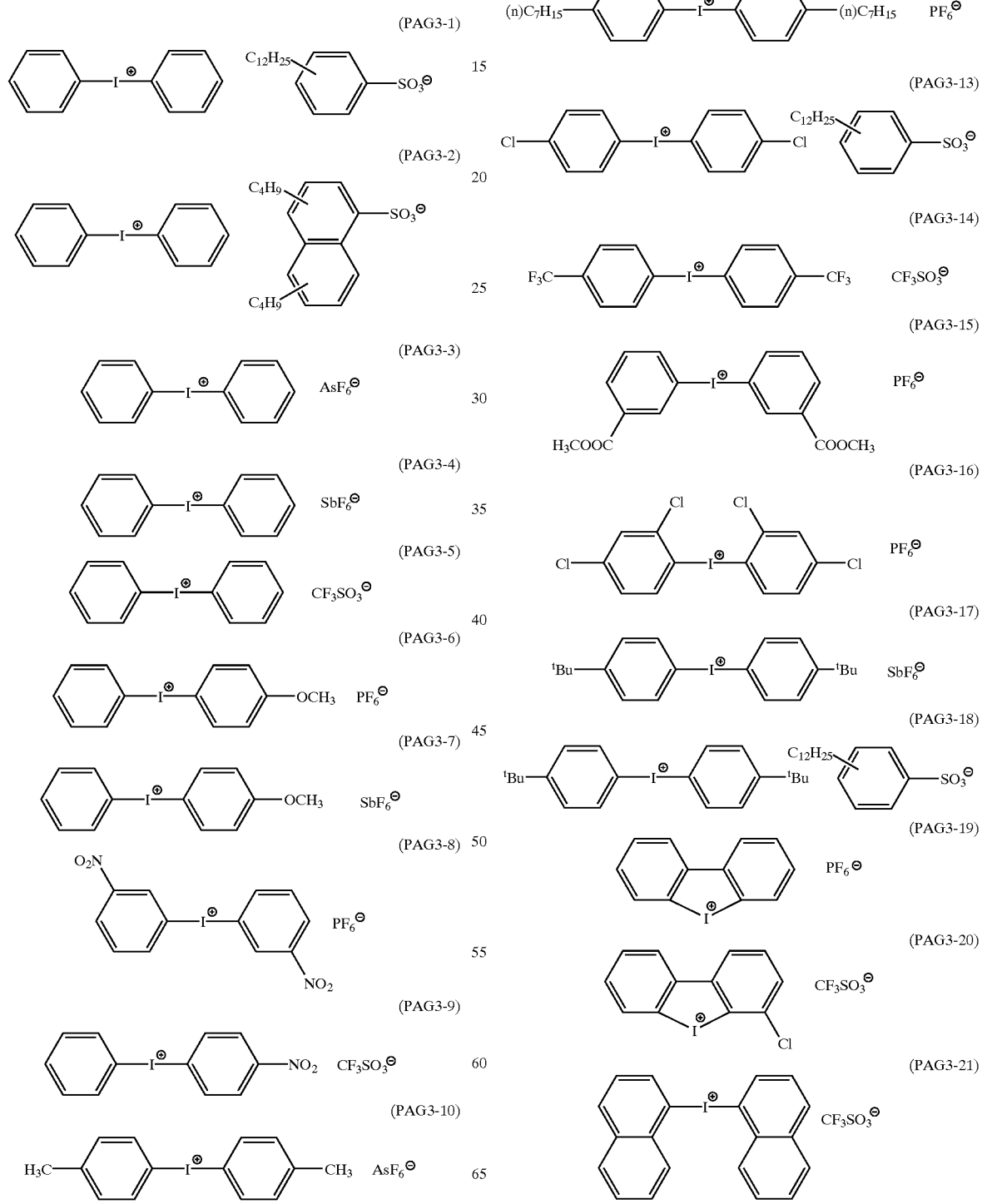

-continued (PAG3-22)

(PAG3-23)

(PAG3-24)

(PAG3-25)

(PAG3-26)

(PAG3-27)

-continued (PAG3-28)

(PAG3-29)

(PAG4-1)

(PAG4-2)

(PAG4-3)

(PAG4-4)

(PAG4-5)

(PAG4-6)

(PAG4-7)

(PAG4-8)

(PAG4-9)

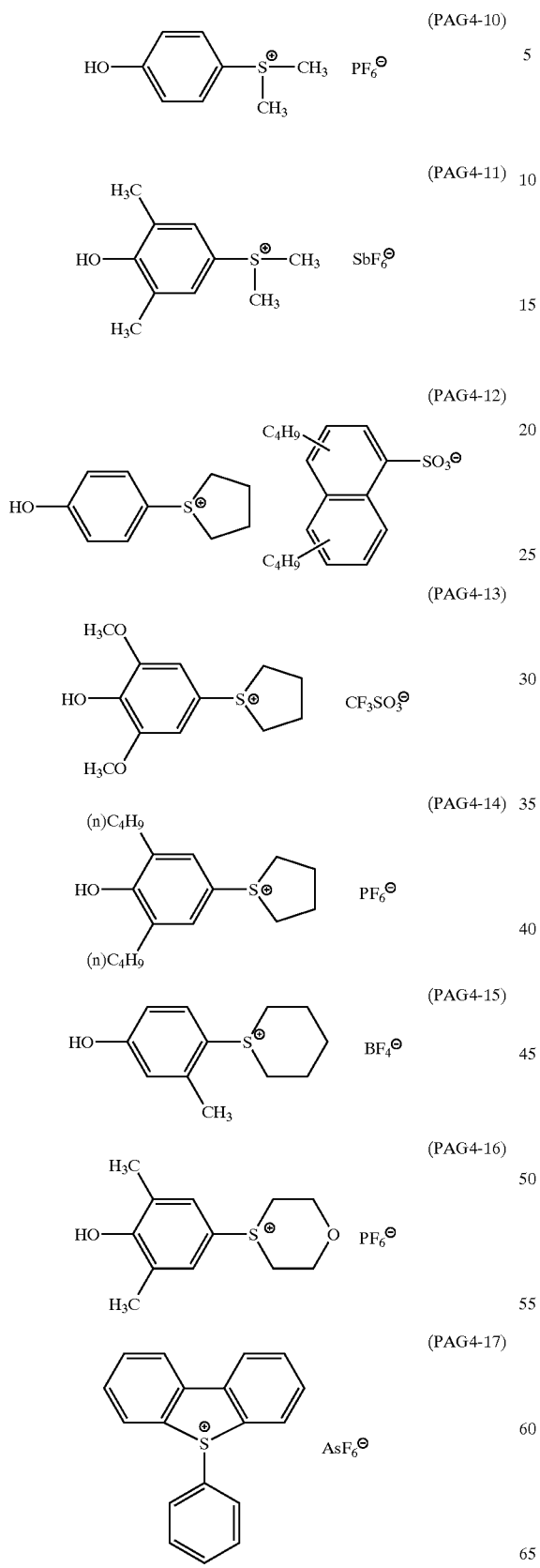
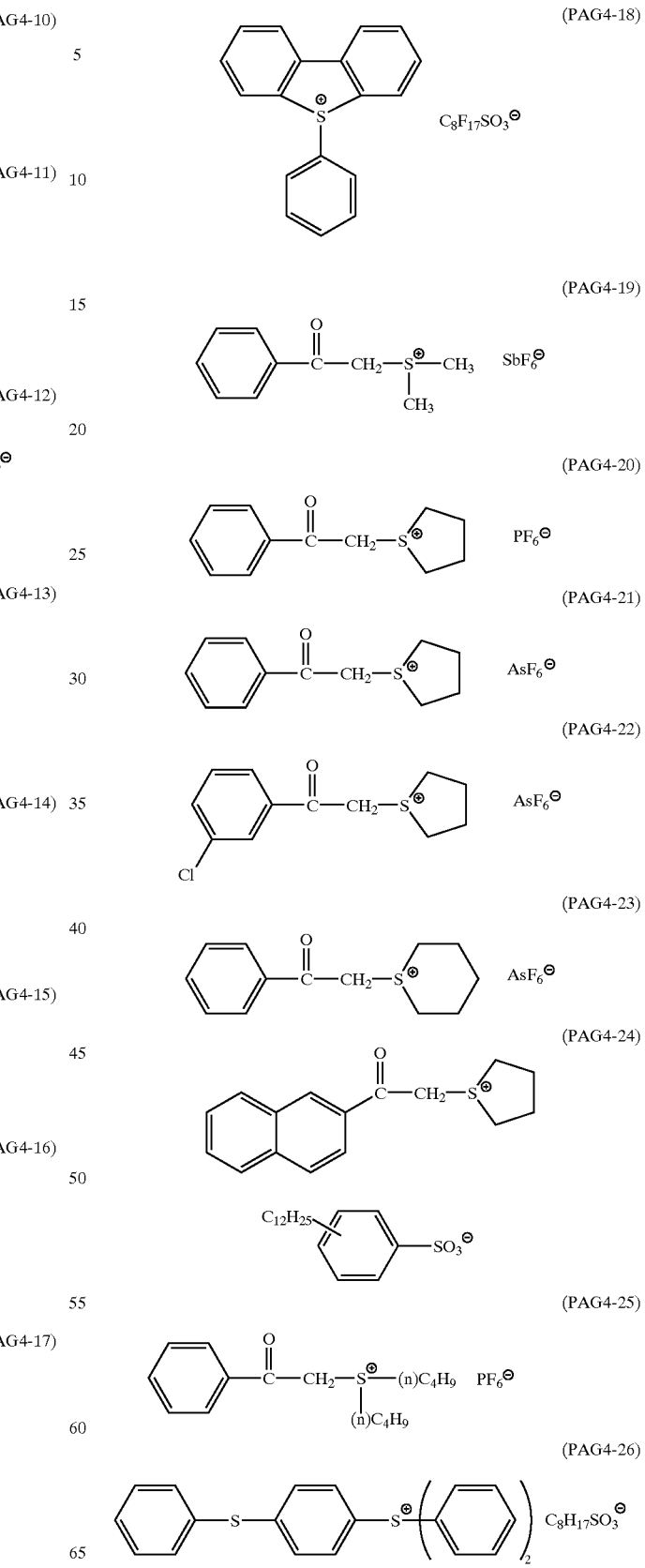

(PAG4-27) (PAG4-28) (PAG4-29) (PAG4-30) (PAG4-31) (PAG4-32) (PAG4-33) (PAG4-34) (PAG4-35) (PAG4-36) (PAG4-37) (PAG5-1) (PAG5-2) (PAG5-3)

(PAG5-4)
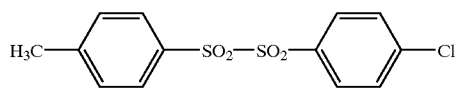

(PAG5-5)
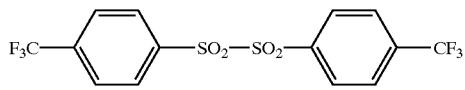

(PAG5-6)
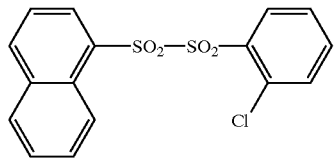

(PAG5-7)
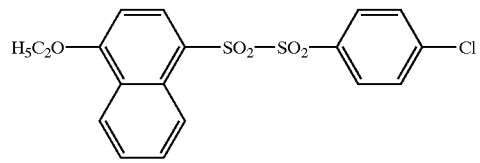

(PAG5-8)
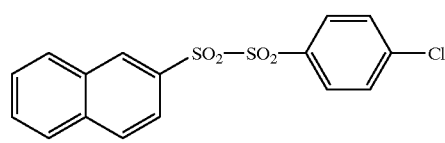

(PAG5-9)
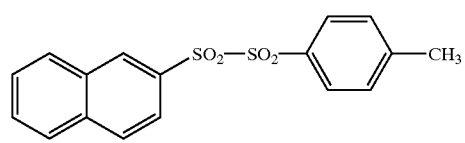

The above-mentioned onium salts represented by general formulas (PAG3) and (PAG4) are known, and can be synthesized, for example, by methods described in J. W. Knapczyk et al., *J. Am. Chem. Soc.*, 91, 145 (1969), A. L. Maycok et al., *J. Org. Chem.*, 35, 2532 (1970), E. Goethas et al., *Bull. Soc. Chem. Belg.*, 73, 546 (1964), H. M. Leicester, *J. Am. Chem. Soc.*, 51, 3587 (1929), J. V. Crivello et al., *J. Polymer Chem. Ed.*, 18, 2677 (1980), U.S. Pat. Nos. 2,807,648 and 4,247,473, and JP-A-53-101331.

(3) Disulfone derivatives represented by the following general formula (PAG5) or iminosulfonate derivatives represented by the following general formula (PAG6):

(PAG5)
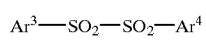

(PAG6)
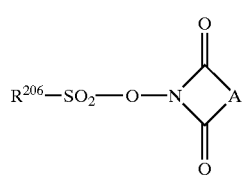

wherein $Ar^3$ and $Ar^4$ each independently represents a substituted or unsubstituted aryl group; $R^{206}$ represents a substituted or unsubstituted alkyl or aryl group; and A represents a substituted or unsubstituted alkylene, alkenylene or arylene group.

Specific examples thereof include but are not limited to the following compounds:

(PAG5-1)
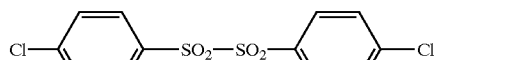

(PAG5-2)
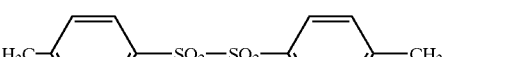

(PAG5-3)
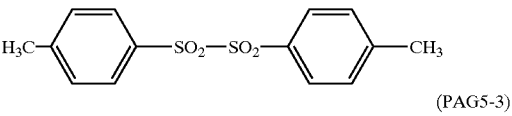

(PAG5-4)
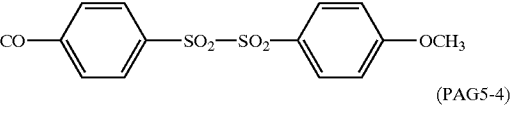

(PAG5-5)
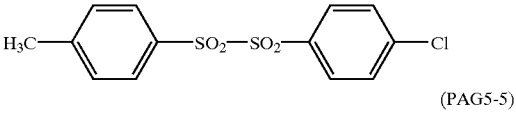

(PAG5-6)
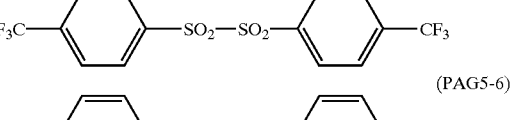

(PAG5-7)
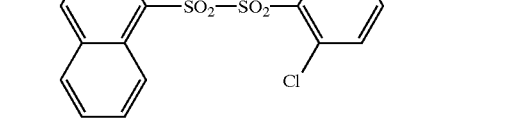

(PAG5-8)
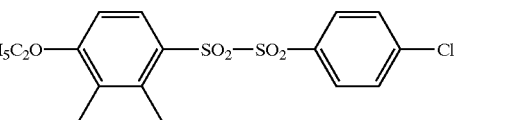

(PAG5-9)
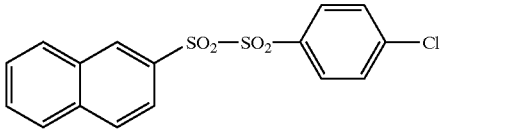

(PAG5-10)
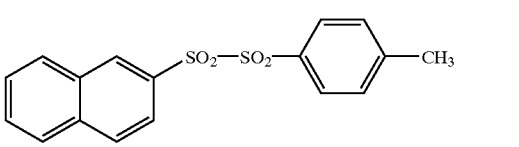

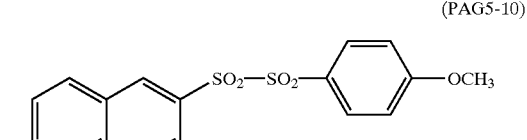

-continued
(PAG5-11)
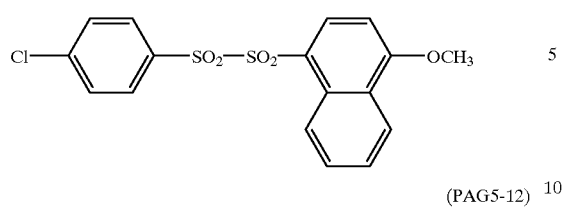
(PAG5-12)
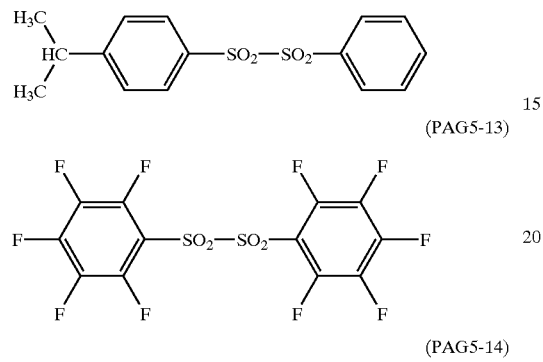
(PAG5-13)
(PAG5-14)
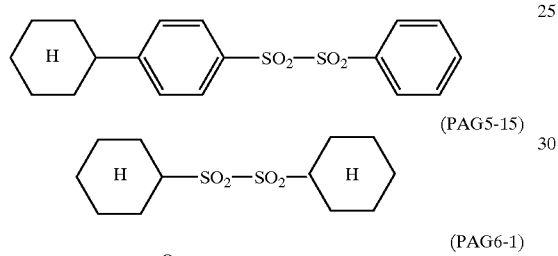
(PAG5-15)
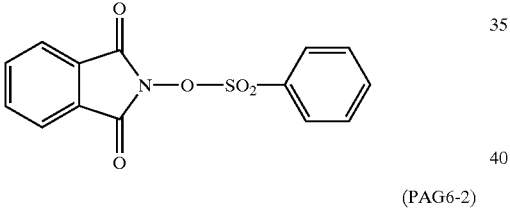
(PAG6-1)
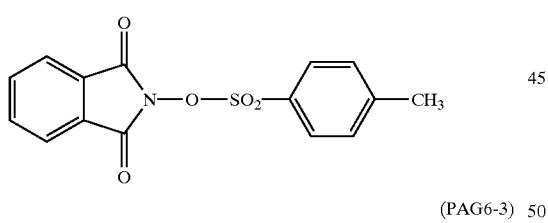
(PAG6-2)
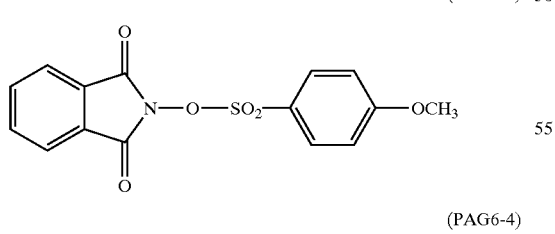
(PAG6-3)
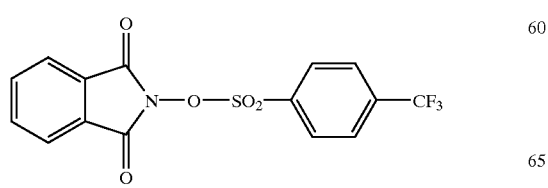
(PAG6-4)
-continued
(PAG6-5)
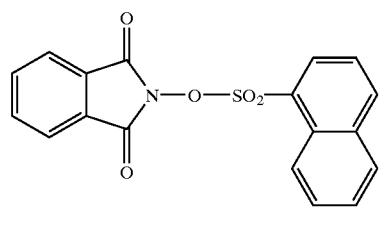
(PAG6-6)
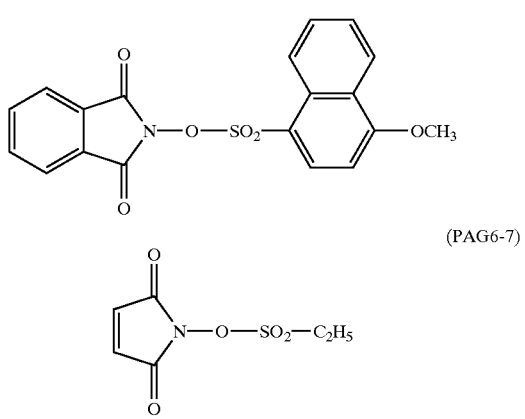
(PAG6-7)
(PAG6-8)
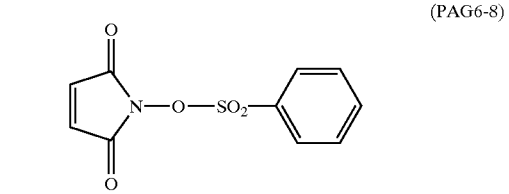
(PAG6-9)
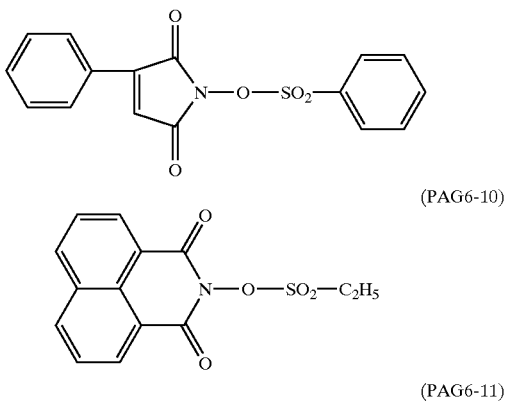
(PAG6-10)
(PAG6-11)
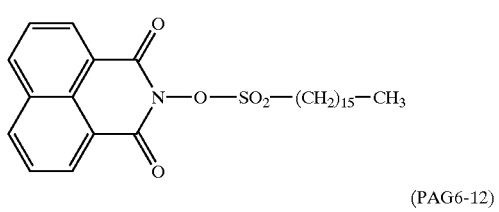
(PAG6-12)
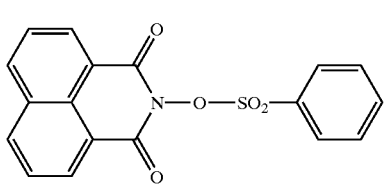

-continued (PAG6-13)
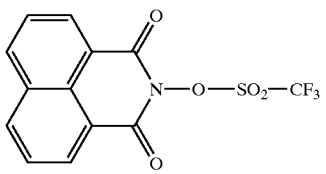

(PAG6-14)

(PAG6-15)

(PAG6-16)

(PAG6-17)
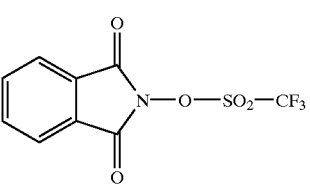

(PAG6-18)
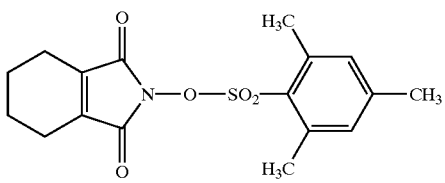

(PAG6-19)
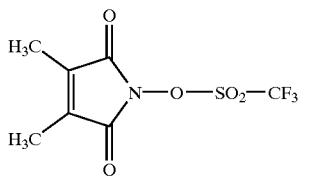

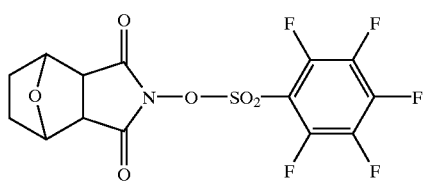

The amount of these compounds (i) added which are decomposable by irradiation of actinic light or radiation to generate acids is usually within the range of 0.001% to 40% by weight, preferably within the range of 0.01% to 20% by weight, and more preferably within the range of 0.1 to 5% by weight, based on the total weight of the compositions of the present invention (excluding coating solvents). If the amount of the compounds (i) added which are decomposable by irradiation of actinic light or radiation to generate acids is less than 0.001% by weight, the sensitivity is decreased. On the other hand, if the amount added is more than 40% by weight, the light absorption of resists becomes too high, unfavorably resulting in deterioration of profiles and narrowing of process (particularly bake) margins.

(ii) Resin Decomposable by Action of Acid to Increase Its Solubility in Alkali

The above-mentioned resin (ii) used in the composition of the present invention which is decomposable by action of an acid to increase its solubility in an alkali (hereinafter also briefly referred to as an alkali-soluble resin (ii)) contains (a) repeating units each having an alkali-soluble group protected with at least one of groups containing alicyclic hydrocarbon structures represented by the above-mentioned general formulas (pI) to (pVI), (b) repeating units represented by the above-mentioned general formula (rI) and (c) repeating units represented by the above-mentioned general formula (sI).

In general formulas (pI) to (pVI), the alkyl groups represented by $R_{12}$ to $R_{25}$, which may be substituted or unsubstituted, indicate straight-chain or branched alkyl groups each having 1 to 4 carbon atoms. The alkyl groups include, for example, methyl, ethyl, n-propyl, isopropyl, n-butyl, isobutyl, sec-butyl and t-butyl.

Substituents for the above-mentioned alkyl groups include alkoxy having 1 to 4 carbon atoms, halogen atoms (fluorine, chlorine, bromine and iodine), acyl, acyloxy, cyano, hydroxyl, carboxyl, alkoxycarbonyl and nitro. The acyl, acyloxy or alkoxycarbonyl group preferably has 1 to 10 carbon atoms, more as preferably 1 to 6 carbon atoms, most preferably 1 to 4 carbon atoms.

The alicyclic hydrocarbon groups represented by $R_{11}$ to $R_{25}$ or it the alicyclic hydrocarbon groups formed by Z and the carbon atom present in formulae (PI) and (PVI) may be either monocyclic or polycyclic. Specifically, they include groups each having a monocyclic, bicyclic, tricyclic or tetracyclic structure having 5 of more carbon atoms. The carbon number thereof is preferably from 6 to 30, and particularly preferably from 7 to 25. These alicyclic hydrocarbon groups may have substituents.

Structure examples of alicyclic moieties of the groups containing the alicyclic hydrocarbon structures are shown below:

(1)

(2)

(3)

(4)
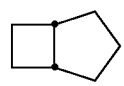

(5)
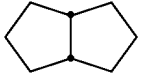

(6)
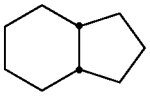

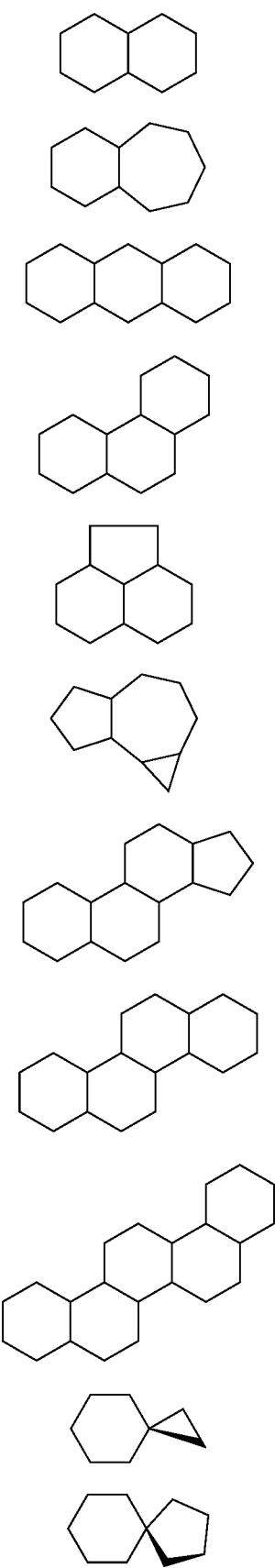
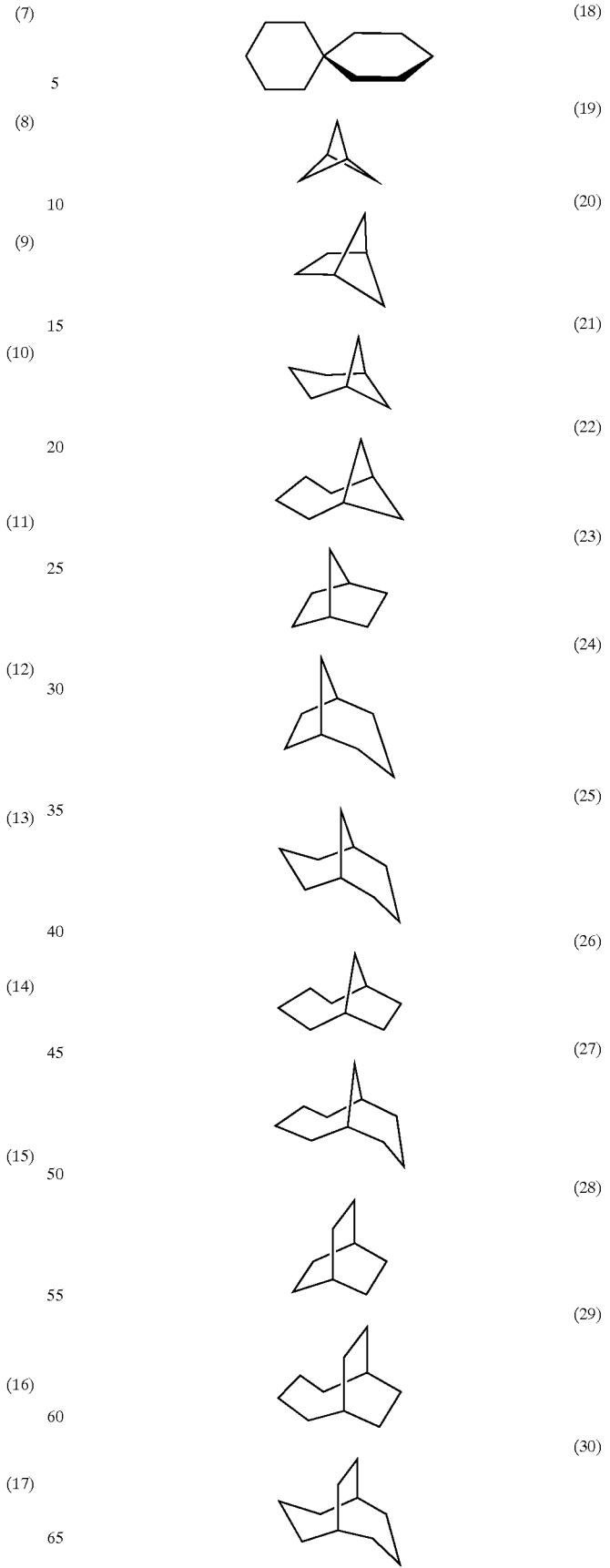

-continued

(31) 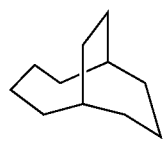

(32) 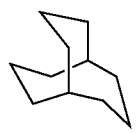

(33) 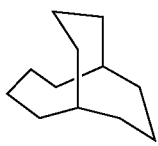

(34) 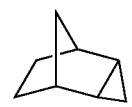

(35) 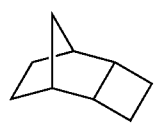

(36) 

(37) 

(38) 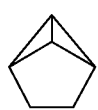

(39) 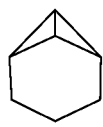

(40) 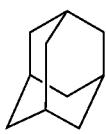

(41) 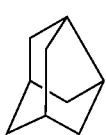

(42) 

-continued

(43) 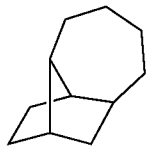

(44) 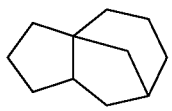

(45) 

(46) 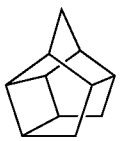

(47) 

(48) 

(49) 

(50) 

In the present invention, preferred examples of the above-mentioned alicyclic moieties include adamantyl, noradamantyl, a decalin residue, tricyclodecanyl, tetracyclododecanyl, norbornyl, cedrol, cyclohexyl, cycloheptyl, cyclooctyl, cyclodecanyl and cyclododecanyl. More preferred are adamantyl, a decalin residue, norbornyl, cedrol, cyclohexyl, cycloheptyl, cyclooctyl, cyclodecanyl and cyclododecanyl.

Substituents for these alicyclic hydrocarbon groups include alkyl, substituted alkyl, halogen atoms, hydroxyl, alkoxy, carboxyl and alkoxycarbonyl. As the alkyl groups, lower alkyl groups such as methyl, ethyl, propyl, isopropyl and butyl are preferred, and more preferred are methyl, ethyl, propyl and isopropyl.

Substituents of the substituted alkyl groups include hydroxyl, halogen atoms and alkoxy. The alkoxy groups include alkoxy groups each having 1 to 4 carbon atoms such as methoxy, ethoxy, propoxy and butoxy.

The alkali-soluble groups protected with the structures represented by general formulas (pI) to (pVI) in the above-mentioned alkali-soluble resins (ii) include various groups known in the art. Specifically, they include carboxylic acid, sulfonic acid, phenol and thiol groups, and preferred are carboxylic acid group and sulfonic acid group.

The alkali-soluble groups protected with the structures represented by general formulas (pI) to (pVI) in the above-mentioned resins preferably include groups represented by the following general formulas (pVII) to (pXI):

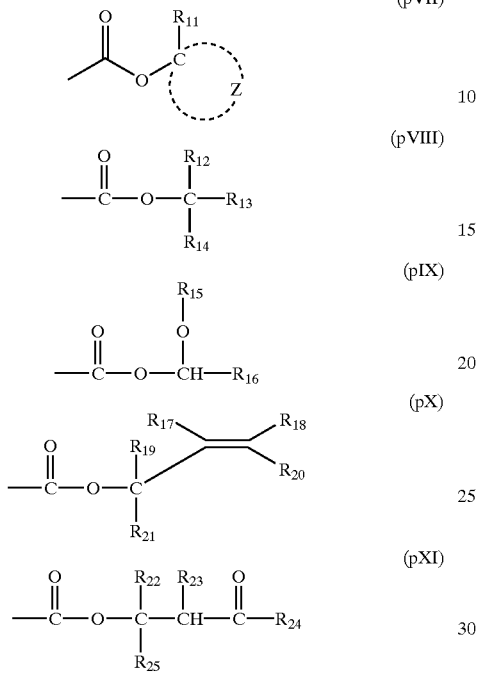

wherein $R_{11}$ to $R_{25}$ and Z have the same meanings as given above, respectively.

As the repeating units (a) having the alkali-soluble groups protected with the structures represented by general formulas (pI) to (pVI), repeating units represented by the following general formula (pA) are preferred.

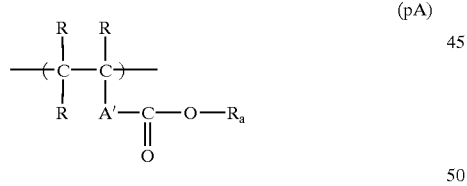

wherein R represents a hydrogen atom, a halogen atom or a substituted or unsubstituted, straight-chain or branched alkyl group having 1 to 4 carbon atoms, and a plurality of Rs may be the same or different; A' represents a single group or a combination of two or more groups selected from the group consisting of a single bond, an alkylene group, a substituted alkylene group, an ether group, a thioether group, a carbonyl group, an ester group, an amido group, a sulfonamido group, a urethane group and a urea group; and Ra represents any of the groups of the above-mentioned formulas (pI) to (pVI).

Specific examples of monomers corresponding to the repeating units represented by general formula (pA) are shown below:

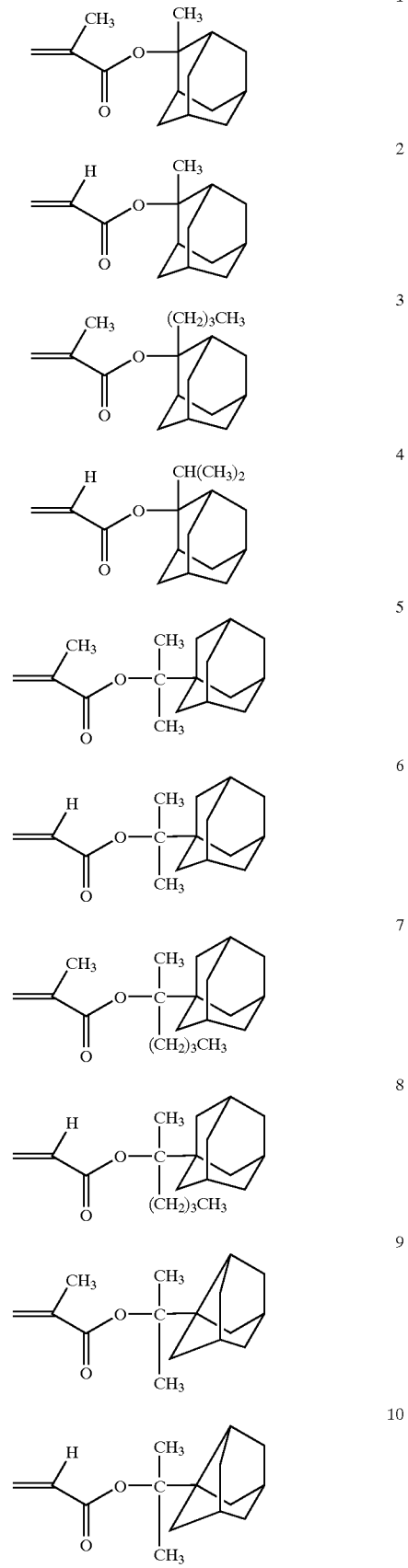

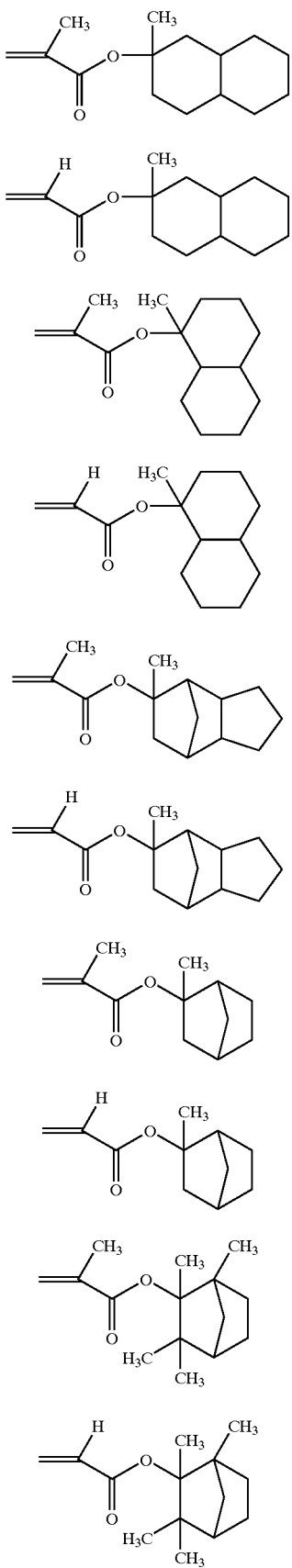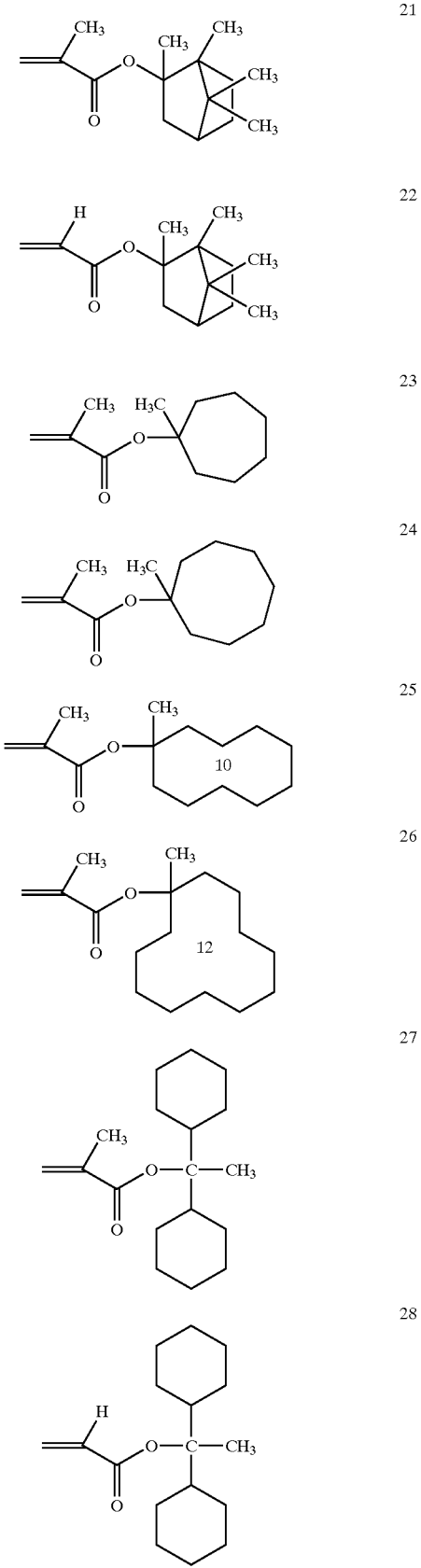

-continued

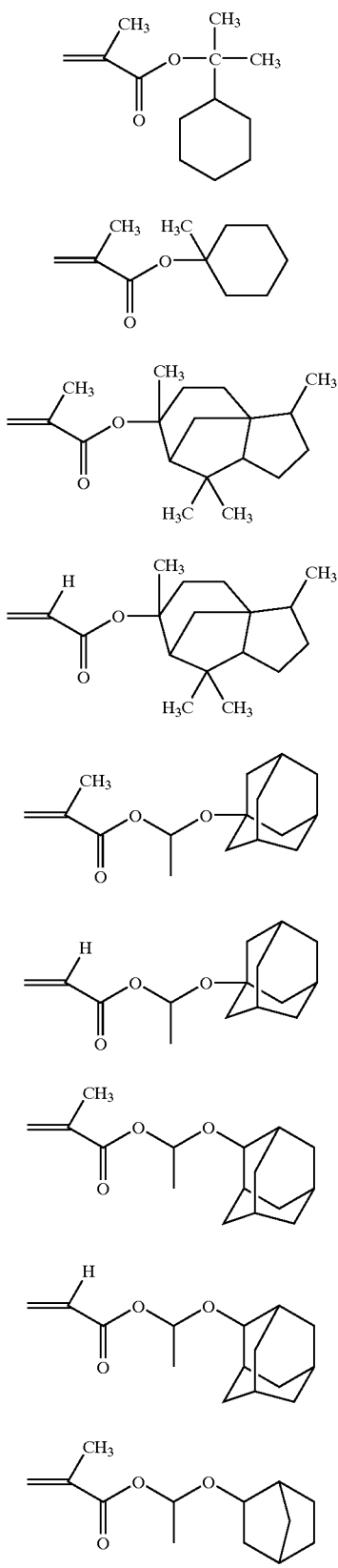

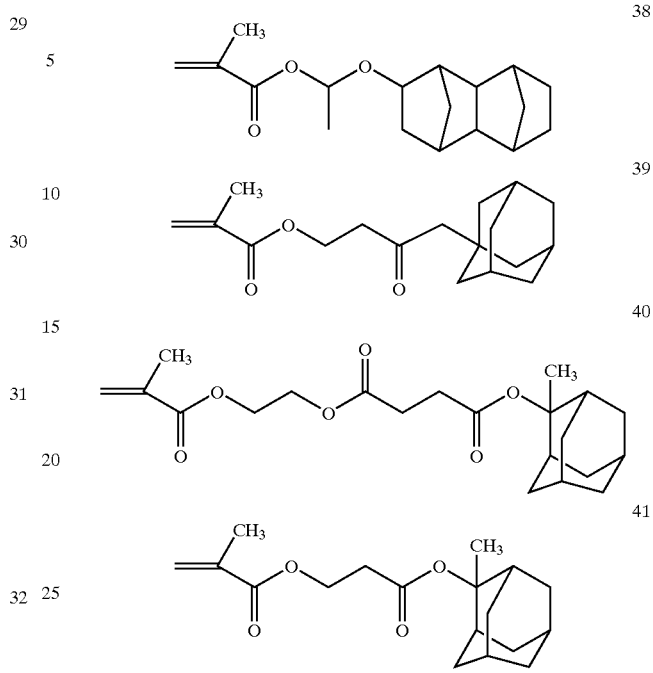

The alkali-soluble resin (ii) contains the repeating units (b) represented by the above-mentioned general formula (rI). The alkyl group represented by $R_5$ of the above-mentioned general formula (rI) is a straight-chain or branched alkyl group having 1 to 4 carbon atoms. Specific examples thereof include methyl, ethyl, n-propyl, isopropyl, n-butyl, isobutyl, sec-butyl and t-butyl. The alkyl group may be substituted, and substituents thereof include alkoxy having 1 to 4 carbon atoms, halogen atoms (for example, fluorine, chlorine, bromine and iodine), acyl, acyloxy, cyano, hydroxyl, carboxyl, alkoxycarbonyl and nitro. The acyl, acyloxy or alkoxycarbonyl group preferably has 1 to 10 carbon atoms, more preferably 1 to 6 carbon atoms, most preferably 1 to 4 carbon atoms. The above-mentioned halogen atoms of $R_5$ include fluorine, chlorine, bromine and iodine.

X of general formula (rI) represents a divalent connecting group. The divalent connecting groups include, for example, groups represented by general formula —C(=O)—Y—A—, wherein Y represents a di-valent connecting group selected from the group consisting of an oxygen atom, a sulfur atom, —NH—, —NHSO$_2$— and —NHSO$_2$NH—, and A represents one group or a combination of two or more groups selected from the group consisting of a single bond, an alkylene group, a substituted alkylene group, an ether group, a thioether group, a carbonyl group, an ester group, an amido group, a sulfonamido group, a urethane group and a urea group.

$R_0$ of general formula (rI) represents such a group that a structure represented by COOR$_0$ is decomposable by action of an acid (also referred to as an acid-decomposable group). The groups represented by $R_0$ herein include tertiary alkyl groups such as t-butyl and t-amyl, isoboronyl groups, 1-alkoxyethyl groups such as 1-ethoxyethyl, 1-butoxyethyl, 1-isobutoxyethyl and 1-cyclohexylethyl, alkoxymethyl groups such as 1-methoxymethyl and 1-ethoxymethyl, tetrahydropyranyl groups, tetrahydrofuranyl groups, trialkylsilyl groups, 3-oxocyclohexyl groups and lactone structures.

Specific examples of the lactone structures are shown below, but are not limited thereto.

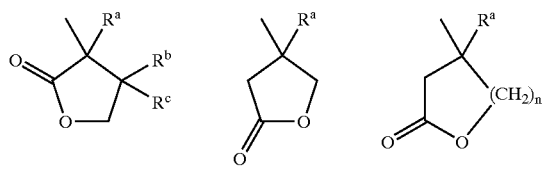

$R^a$, $R^b$ and $R^c$ of the above-mentioned lactone structures each represents a hydrogen atom or a straight-chain or branched alkyl group having 1 to 4 carbon atoms, which may have a substituent; and n is an integer of 2 to 4.

When $R_0$ represents a lactone structure in the above-mentioned general formula (rI), specific examples of the repeating units are shown below:

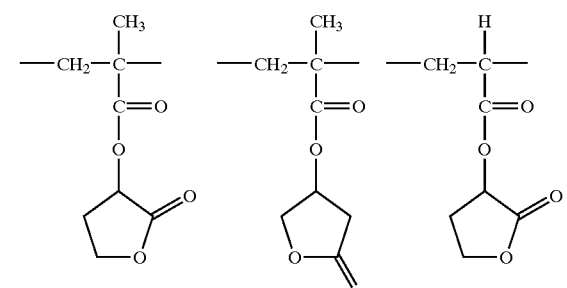

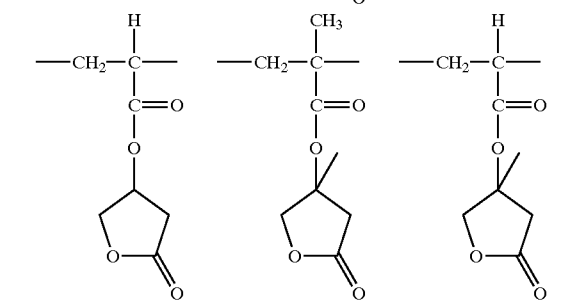

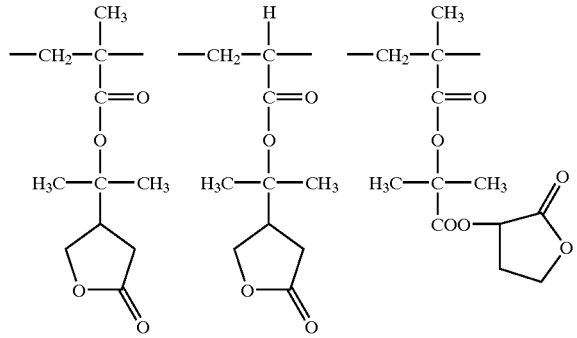

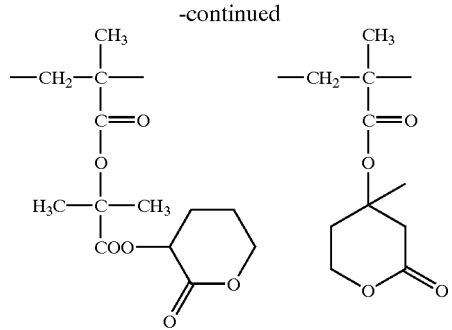

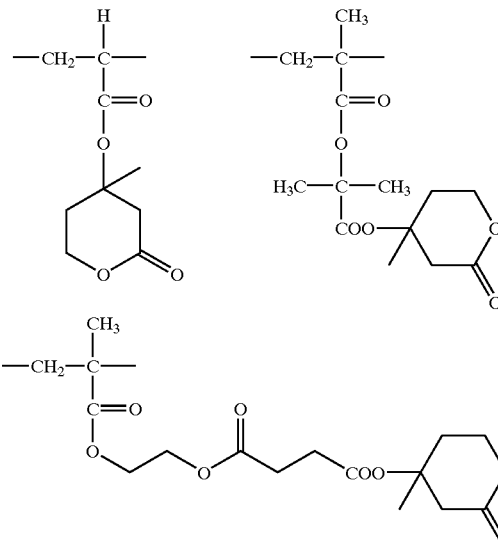

The alkali-soluble resin (ii) further contains the repeating units (c) represented by the above-mentioned general formula (sI). $R_6$ of the general formula (sI) is the same as $R_5$ of above-mentioned general formula (rI) for the halogen atoms and the straight-chain or branched alkyl groups each having 1 to 4 carbon atoms, including the specific examples.

Specific examples of monomers giving the repeating units (c) represented by the above-mentioned general formula (sI) include acrylic acid, methacrylic acid, 2-chloroacrylic acid and 2-bromoacrylic acid.

The alkali-soluble resin (ii) may contain repeating units other than the repeating units (a), (b) and (c).

Such other repeating units are preferably repeating units represented by the following general formula (AI):

(AI)

wherein R has the same meaning as with the above-mentioned general formula (pA); and B represents a halogen atom, a cyano group, a group decomposable by action of an acid, —C(=O)—Y'—A'—$R_{c9}$ or —COOR$_{c10}$, wherein Y' represents a divalent connecting group selected from an oxygen atom, a sulfur atom, —NH—, —NHSO$_2$— and NHSO$_2$NH—, $R_{c9}$ represents —COOH, —COOR$_{c10}$ ($R_{c10}$ has the same meaning as given for $R_{c11}$), —CN, a hydroxyl group, an alkoxy group which may have a substituent, —CO—NH-$R_{c11}$ or —CO—NH—SO$_2$—$R_{11}$, $R_{11}$ represents an alkyl group which may have a substituent or a cyclic hydrocarbon group which may have a substituent, and A' represents one group or a combination of two or more groups selected from the group consisting of a single bond, an alkylene group, a substituted alkylene group, an ether group, a thioether group, a carbonyl group, an ester group, an amido group, a sulfonamido group, a urethane group and a urea group, namely, has the same meaning as given for A' in the above-mentioned general formula (pA).

The group represented by B of the above-mentioned general formula (AI) is preferably a group represented by —C(=O)—$X_1$—RO. The groups represented by R0 herein include tertiary alkyl groups such as t-butyl and t-amyl, isoboronyl groups, 1-alkoxyethyl groups such as 1-ethoxyethyl, 1-butoxyethyl, 1-isobutoxyethyl and 1-cyclohexyloxyethyl, alkoxymethyl groups such as 1-methoxymethyl and 1-ethoxymethyl, tetrahydropyranyl groups, tetrahydrofuranyl groups, trialkylsilyl groups and 3-oxocyclohexyl groups. $X_1$ represents an oxygen atom, a sulfur atom, —NH—, —$NHSO_2$— or —$NHSO_2NH$—, and is preferably an oxygen atom.

The alkyl groups represented by $R_{c11}$ described above are preferably straight-chain or branched alkyl groups each having 1 to 10 carbon atoms, more preferably straight-chain or branched alkyl groups each having 1 to 6 carbon atoms, and still more preferably methyl, ethyl, propyl, isopropyl, n-butyl, isobutyl, sec-butyl and t-butyl.

The cyclic hydrocarbon groups represented by $R_{c11}$ described above are, for example, cyclic alkyl groups and bridge-containing hydrocarbons, and include cyclopropyl, cyclopentyl, cyclohexyl, adamantyl, boronyl, isoboronyl, tricyclodecanyl, dicyclopentenyl, nobornanepoxy, menthyl, isomenthyl, neomenthyl and tetracyclododecanyl.

The alkoxy groups represented by $R_{c9}$ described above include alkoxy groups each having 1 to 4 carbon atoms such as methoxy, ethoxy, propoxy and butoxy.

Substituents for the above-mentioned alkyl, cyclic alkyl and alkoxy groups include a hydroxyl group, a halogen atom, a carboxyl group, an alkoxy group, an acyl group, a cyano group and an acyloxy group. Examples of the alkoxy group include an alkoxy group having 1 to 4 carbon atoms such as methoxy, ethoxy, propoxy and butoxy, examples of the acyl group include formyl and acetyl, and examples of the acyloxy group include acetoxy.

The alkylene groups and the substituted alkylene groups represented by A' in the above-mentioned general formulas (AI) and (pA) and A in general formula (rI) include groups represented by the following formula:

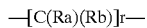

wherein Ra and Rb, which may be the same or different, each represents a hydrogen atom, an alkyl group, a substituted alkyl group, a halogen atom, a hydroxyl group or an alkoxy group. The alkyl groups are preferably lower alkyl groups such as methyl, ethyl, propyl, isopropyl and butyl, and more preferably, represent substituents selected from the group consisting of methyl, ethyl, propyl and isopropyl. Substituents of the substituted alkyl groups include hydroxyl, halogen atoms and alkoxy. The alkoxy groups include groups each having 1 to 4 carbon atoms such as methoxy, ethoxy, propoxy and butoxy. r represents an integer of 1 to 10.

In the above, the halogen atoms include chlorine, bromine, fluorine and iodine.

As B described above, an acid-decomposable group or a mevalonic lactone group is preferred.

In the alkali-soluble resins (ii) used in the present go invention, it is preferred that copolymerization components such as the repeating units represented by the above-mentioned general formula (AI) contain acid-decomposable groups other than the alkali-soluble groups protected with the groups containing the structures represented by the above-mentioned general formulas (pI) to (pVI). Such acid-decomposable groups which can be used in combination are preferably groups represented by —C(=O)—O—R0 described above.

In the alkali-soluble resins (ii), the molar ratio of the respective repeating units contained can be appropriately determined for controlling the acid value, the resistance to dry etching, the standard developing solution suitability, the adhesion to substrates, the defocus latitude depended on line pitch of resist profiles, and further, the resolution, heat resistance and sensitivity generally required for resists.

Preferred specific examples of the structures of the alkali-soluble resins (ii) are described below, but are not limited thereto.

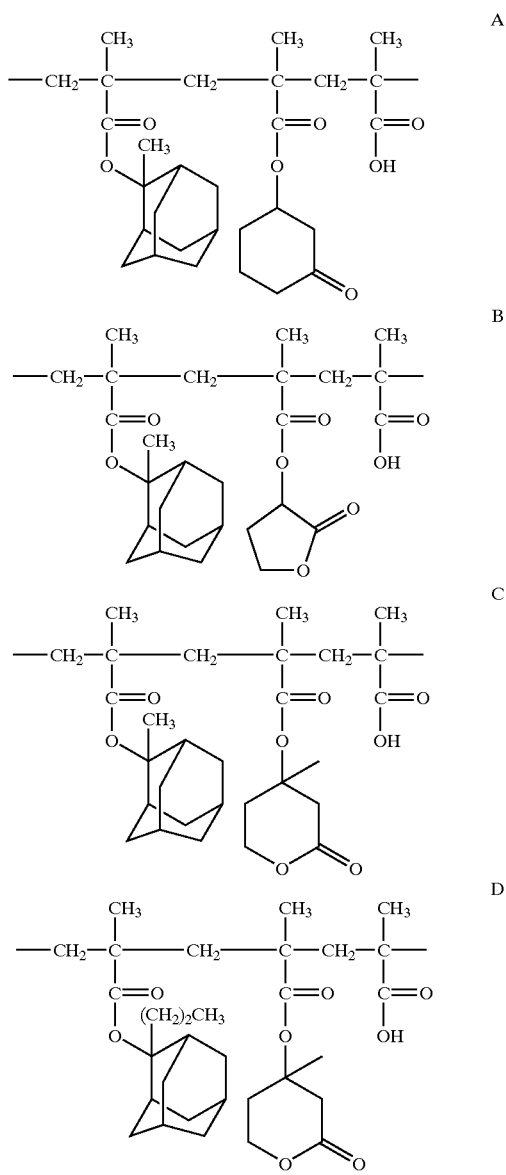

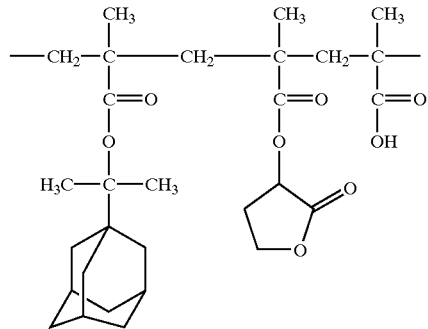

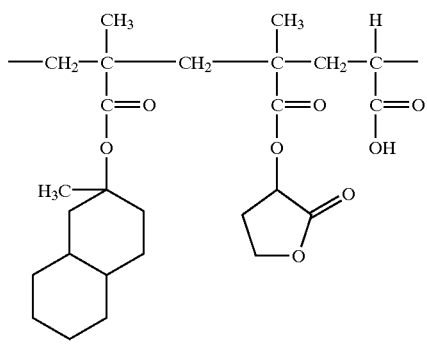

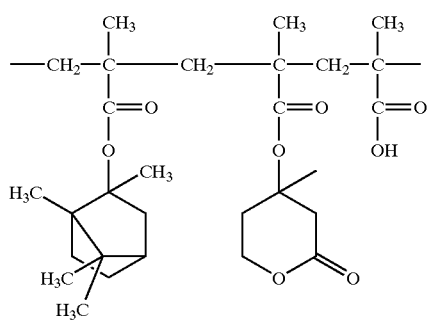

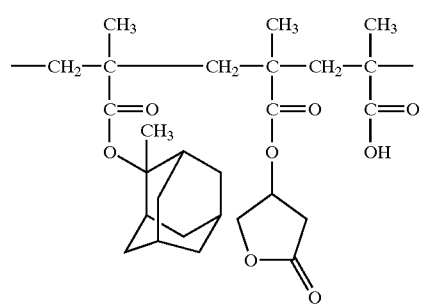

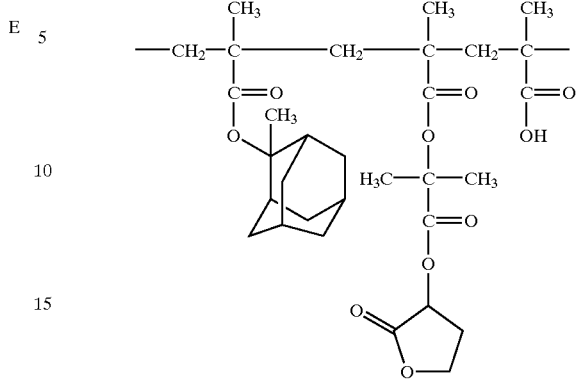

In the alkali-soluble resins (ii), the content of the repeating structural units (a) having the alkali-soluble groups protected with the structures represented by general formulas (pI) to (pVI) is preferably from 20 mol % to 70 mol %, more preferably from 25 mol % to 65 mol %, and most preferably from 30 mol % to 60 mol %, based on the total repeating units. The excessive existence of the repeating units (a) results in the difficulty of image formation, whereas too little the existence thereof deteriorates the resistance to dry etching.

The content of the repeating structural units (b) represented by the above-mentioned general formula (rI) is preferably from 20 mol % to 70 mol %, more preferably from 25 mol % to 65 mol %, and still more preferably from 30 mol % to 60 mol %, based on the total repeating units. The excessive existence of the repeating units (b) deteriorates the resistance to dry etching, whereas too little the existence thereof results in the difficulty of image formation.

The content of the repeating structural units (c) represented by the above-mentioned general formula (sI) is preferably from 5 mol % to 18 mol %, more preferably from 8 mol % to 18 mol %, and still more preferably from 10 mol % to 18 mol %, based on the total repeating units. If the repeating units (c) exist in an amount exceeding 18 mol %, the film reduction in resists after exposure and development arises to an appreciable degree in the positive photoresist compositions of the present invention. On the other hand, if the repeating units (c) exist in an amount less than 10 mol %, defocus latitude depended on line pitch of resists is undesirably caused.

In the alkali-soluble resins (ii), the total content of the repeating units (a) having the alkali-soluble groups protected with the structures represented by general formulas (pI) to (pVI) and the other repeating units having the acid-decomposable groups is preferably from 15 mol % to 70 mol %, more preferably from 20 mol % to 65 mol %, and still more preferably from 25 mol % to 60 mol %, based on the total repeating units.

In the resins, the content of repeating units based on the monomers of copolymerization components other than the repeating units (a), (b) and (c) can also be appropriately established depending on desired performances of resists. In general, however, it is preferably 50 mol % or less, more preferably 40 mol % or less, and still more preferably 30 mol % or less, based on the total molar number of the repeating units (a), (b) and (c).

The weight average molecular weight Mw of the alkali-soluble resins (ii) ranges preferably from 1,000 to 1,000,000, more preferably from 1,500 to 500,000, still more preferably from 2,000 to 200,000, and most preferably from 2,500 to 100,000 as a value measured by gel permeation chromatography, by the polystyrene standard. The use of the alkali-soluble resin having a higher weight average molecular weight improves heat resistance but lowers development properties. It is therefore adjusted to the preferred range according to the balance of these.

The alkali-soluble resins (ii) used in the present invention can be synthesized by conventional methods, for example, radical polymerization methods.

In the positive photoresist compositions for far ultraviolet ray exposure of the present invention, the amount of the alkali-soluble resins (.ii) added to the entire compositions is preferably from 40% to 99.99% by weight, and more preferably from 50% to 99.97% by weight, based on the solid content of all resists.

The positive photoresist compositions for far ultraviolet ray exposure of the present invention may further contain acid-decomposable dissolution inhibitive compounds, dyes, plasticizers, surfactants, photosensitizers, organic basic compounds and compounds for enhancing the solubility in developing solutions other than the above, if necessary.

The organic basic compounds which can be used in the present invention are compounds stronger in basicity than phenol. Nitrogen-containing basic compounds are preferred among others.

Preferred examples thereof include structures of the following formulas (A) to (E):

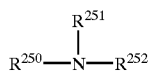
(A)

wherein $R^{250}$, $R^{251}$ and $R^{252}$, which may be the same or different, each represents a hydrogen atom, an alkyl group having 1 to 6 carbon atoms, an aminoalkyl group having 1 to 6 carbon atoms, a hydroxyalkyl group having 1 to 6 carbon atoms, or a substituted or unsubstituted aryl group, and $R^{251}$ and $R^{252}$ may combine with each other to form a ring.

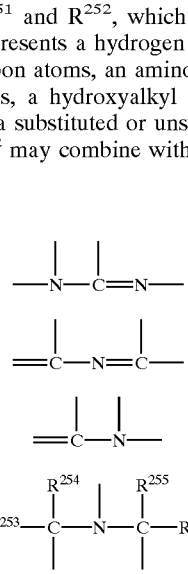

wherein $R^{253}$, $R^{254}$, $R^{255}$ and $R^{256}$, which may be the same or different each represents an alkyl group having 1 to 6 carbon atoms.

The nitrogen-containing basic compounds are more preferably compounds each having two or more nitrogen atoms different in chemical environment, and particularly preferred are compounds each having both a substituted or unsubstituted amino group and a nitrogen atom-containing ring structure, or compounds having alkylamino groups. Preferred examples thereof include substituted or unsubstituted guanidine, substituted or unsubstituted aminopyridine, substituted or unsubstituted aminoalkylpyridines, substituted or unsubstituted aminopyrrolidine, substituted or unsubstituted indazole, substituted or unsubstituted pyrazole, substituted or unsubstituted pyrazine, substituted or unsubstituted pyrimidine, substituted or unsubstituted purine, substituted or unsubstituted imidazoline, substituted or unsubstituted pyrazoline, substituted or unsubstituted piperazine, substituted or unsubstituted aminomorpholine and substituted or unsubstituted aminoalkylmorpholines. Preferred substituents are amino, aminoalkyl, alkylamino, aminoaryl, arylamino, alkyl, alkoxy, acyl, acyloxy, aryl, aryloxy, nitro, hydroxyl and cyano. Particularly preferred examples of the compounds include but are not limited to guanidine, 1,1-dimethylguanidine, 1,1,3,3-tetramethylguanidine, 2-aminopyridine, 3-aminopyridine, 4-aminopyridine, 2-dimethylaminopyridine, 4-dimethylamino-pyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethyl-pyridine, 4-aminoethylpyridine, 3-aminopyrrolidine, piperazine, N-(2-aminoethyl) piperazine, N-(2-aminoethyl)-piperidine, 4-amino-2,2,6,6-tetramethylpiperidine, 4-piperidinopiperidine, 2-iminopiperidine, 1-(2-aminoethyl)-pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine and N-(2-aminoethyl)morpholine.

These nitrogen-containing basic compounds are used alone or as a combination of two or more of them.

The amount of the nitrogen-containing basic compounds used is usually from 0.001 part to 10 parts by weight, and preferably form 0.01 part to 5 parts by weight, based on 100 parts by weight of photosensitive resin composition (excluding solvent). Less than 0.001 part by weight does not give the effects of the present go invention, whereas exceeding 10 parts by weight results in liability to decrease the sensitivity and to deteriorate the development properties of non-exposed areas.

Amine compounds are preferably added among others as the above-mentioned organic basic compounds, from the viewpoints of not only decreasing changes in performance until after heating after exposure, but also more improving the defocus latitude depended on line pitch of patterns which is the effect of the present invention.

Preferred examples of the amine compounds (iii) include 1,5-diazabicyclo[4.3.0]-5-nonene, 1,8-diazabicyclo[5.4.0]-7-undecene, 1,4-diazabicyclo[2.2.2]octane, 4-dimethylamino-pyridine, hexamethylenetetramine, 1-naphthylamine, 4,4-dimethylimidazoline, pyrroles, pyrazole, imidazoles, pyridazines and pyrimidines. Particularly preferred are 1,5-diazabicyclo[4.3.0]-5-nonene, 1,8-diazabicyclo[5.4.0]-7-undecene, 1,4-diazabicyclo[2.2.2] octane, 4-dimethylamino-pyridine, hexamethylenetetramine and 1-naphthylamine. These amine compounds (iii) can be used either alone or as a combination of two or more of them. Further, organic basic compounds other than the above-mentioned amine compounds (iii) can be used either in combination with the amine compounds (iii) or alone.

The compositions of the present invention are dissolved in solvents dissolving the above-mentioned respective components, and applied onto supports. Preferred examples of the solvents used herein include diethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethyl sulfoxide, N-methylpyrrolidinone and tetrahydrofuran. These solvents are used either alone or as a mixture thereof.

Of the above, preferred examples of the solvents include 2-heptanone, γ-butyrolactone, ethylene glycol monomethyl ether, ethylene glycol monoethyl ether, ethylene glycol monoethyl ether acetate, propylene glycol monomethyl ether, propylene glycol monomethyl ether, methyl lactate, ethyl lactate, methyl methoxypropionate, ethyl ethoxypropionate, N-methylpyrrolidinone and tetrahydrofuran.

It is preferred that the surfactants (iv) are added to the above-mentioned solvents. Specific examples of the surfactants (iv) include nonionic surfactants such as polyoxyethylene alkyl ethers such as polyoxyethylene lauryl ether, polyoxyethylene stearyl ether, polyoxyethylene cetyl ether and polyoxyethylene oleyl ether, polyoxyethylene alkyl allyl ethers such as polyoxyethylene octyl phenol ether and polyoxyethylene nonyl phenol ether, polyoxyethylene-polyoxypropylene copolymers, sorbitan fatty acid esters such as sorbitan monolaurate, sorbitan monopalmitate, sorbitan monostearate, sorbitan monooleate, sorbitan trioleate and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate; fluorine surfactants such as Eftop EF301, EF303 and EF352 (manufactured by Shin Akita Kasei Co., Ltd.), Megafac F171, F173 and 177 (manufactured by Dainippon Ink & Chemicals Inc.), Florad FC430 and FC431 (manufactured by Sumitom 3M Ltd.), Asahiguard AG710, and Surflon S-382, SC101, SC102, SC103, SC104, SC105 and SC106 (manufactured by Asahi Glass Co., Ltd.); Organosiloxane Polymer KP341 (manufactured by Shin-Etsu Chemical Co., Ltd.); and acrylic acid or methacrylic acid (co) polymers, Polyflow No. 75 and No. 95 (manufactured by Kyoeisha Yusi Kagaku Kogyo Co., Ltd.).

Fluorine surfactants are preferably used among others.

The amount of the above-mentioned surfactants (iv) added is preferably 2 parts by weight or less, and more preferably 1 part by weight, per 100 parts by weight of solid in the composition of the present invention.

These surfactants maybe added either alone or as a combination of some of them.

Such positive photoresist compositions for far ultraviolet ray exposure of the present invention are applied onto substrates to form thin films. The thickness of the coating films is preferably from 0.4 µm to 1.5 µm.

The above-mentioned compositions are applied onto substrates (for example, silicon/silicon dioxide coating) as used for the production of precision integrated circuit elements by appropriate coating methods such as methods using spinners or coaters, followed by exposure through a specified mask, baking and development. Thus, good resist patterns can be obtained. Exposure light used herein is preferably far ultraviolet rays having a wavelength of preferably 250 nm or less, more preferably 220 nm or less. Specific examples thereof include a KrF excimer laser beam (248 nm), an ArF excimer laser beam (193 nm), an $F_2$ excimer laser beam (157 nm), X-rays and electron beams, and an ArF excimer laser beam (193 nm) is particularly preferred.

Developing solutions for the compositions of the present invention which can be used include alkaline solutions of inorganic alkalis such as sodium hydroxide, potassium hydroxide, sodium carbonate, sodium silicate, sodium metasilicate and aqueous ammonia; primary amines such as ethylamine and n-propylamine; secondary amines such as diethylamine and di-n-butylamine; tertiary amines such as triethylamine and methyldiethylamine; alcohol amines such as dimethylethanolamine and triethanolamine; quaternary ammonium salts such as tetramethylammonium hydroxide and tetraethyl-ammonium hydroxide; and cyclic amines such as pyrrole and piperidine.

Further, alcohols and/or surfactants can also be added in appropriate amounts to the above-mentioned alkaline solutions.

The present invention will hereinafter be described in more detail by reference to examples. However, the present invention is not limited thereto.

SYNTHESIS EXAMPLE 1

Synthesis of Photo-acid generator (PAG4–35)

Diphenyl sulfoxide (50 g) was dissolved in 800 ml of mesitylene, and 200 g of aluminum chloride was added thereto, followed by stirring at 80° C. for 24 hours. After the reaction was completed, the reaction solution was slowly poured into 2 liters of ice. Then, 400 ml of concentrated hydrochloric acid was added thereto, followed by heating at 70° C. for 10 minutes. After the reaction solution was cooled to room temperature, it was washed with ethyl acetate and filtered. To the resulting filtrate, 200 g of ammonium iodide dissolved in 400 ml of distilled water was added. The precipitated powder was taken by filtration, washed with water, washed with ethyl acetate and dried to obtain 72 g of sulfonium iodide.

Fifty grams of sulfonium iodide thus obtained dissolved in 300 ml of methanol, and 31 g of silver oxide was added thereto, followed by stirring for 4 hours. After the reaction solution was filtered, the salt interchange with potassium heptadecafluorooctanesulfonate was conducted to collect 40 g of (PAG4–35), a desired product.

The following Synthesis Example 2 is a synthesis example of the alkali-soluble resin (ii) used in the composition of the Tier present invention.

SYNTHESIS EXAMPLE 2

Synthesis of Resin A-1

2-Methyl-2-adamantyl methacrylate giving repeating units (a), 3-oxocyclohexyl methacrylate giving repeating units (b) and methacrylic acid giving repeating units (c) were placed in a vessel at a ratio of 45/43/12 (mol %), and dissolved in a 38/2 (volume ratio) mixed solvent of N,N-dimetylacetamide/tetrahydrofuran to prepare 100 ml of a solution having a solid content of 20%. To this solution, 3 mol % of V-65 manufactured by Wako Pure Chemical Industries Ltd. and 4 mol % of mercaptoethanol were added, and the resulting solution was added dropwise for 3 hours to 10 ml of tetrahydrofuran heated to 60° C. under an atmosphere of nitrogen. After the solution had been added dropwise, the reaction solution was heated and stirred for 6 hours. After the reaction was completed, the reaction solution was cooled to room temperature, and crystallization was performed in 3 liters of methanol. A white powder precipitated was collected to obtain resin A-1.

The polymer composition ratio ((a)/(b)/(c)) of resin A-1 determined from $^{13}$C-NMR was 44/42/1.4 (mol %). The weight average molecular weight determined by the GPC measurement was 7,500 in terms of standard polystyrene.

SYNTHESIS EXAMPLE 3

Synthesis of Resin M-1 (Comparison)

2-Methyl-2-adamantyl methacrylate and α-methacryloyloxy-γ-butyrolactone were placed in a vessel at a molar ratio of 50/50 (40.0 g/29.0 g), and 2-fold excess by weight of methyl isobutyl ketone in relation to all monomers was added thereto to form a solution. Azobisisobutyronitrile was added thereto as an initiator in an amount of 2 mol % based on the total amount of monomers, followed by heating at 80° C. for about 8 hours. Then, the reaction solution was pouted into a large amount of heptane to precipitate a product. This procedure was repeated twice to purify the product, thus obtaining resin M-1.

The polymer composition ratio of resin M-1 was 50/50 (mol %), and the weight average molecular weight thereof was about 8,000.

Resins shown in Table 1 were each synthesized in a manner similar to that of Synthesis Example 1.

TABLE 1

| Resin | Repeating Unit (mol %) | | | Weight Average Molecular Weight |
|---|---|---|---|---|
| | (a) | (b) | (c) | |
| A-1 | 45 | 43 | 12 | 7500 |
| A-2 | 42 | 42 | 16 | 7100 |
| B-1 | 43 | 42 | 15 | 6900 |
| B-2 | 46 | 44 | 10 | 7200 |
| C-1 | 44 | 43 | 13 | 7900 |
| C-2 | 42 | 42 | 16 | 8200 |
| D-1 | 42 | 44 | 14 | 7800 |
| D-2 | 43 | 39 | 18 | 8100 |
| E-1 | 43 | 40 | 17 | 7800 |
| E-2 | 44 | 42 | 14 | 8200 |
| F-1 | 45 | 43 | 12 | 6900 |
| F-2 | 43 | 43 | 14 | 7200 |
| G-1 | 44 | 43 | 13 | 6500 |
| G-2 | 42 | 42 | 16 | 6800 |
| H-1 | 45 | 44 | 11 | 8900 |
| H-2 | 42 | 43 | 15 | 8700 |
| I-1 | 40 | 45 | 15 | 7900 |
| I-2 | 39 | 43 | 18 | 8200 |
| B-3 | 48 | 47 | 5 | 8600 |
| B-4 | 46 | 46 | 8 | 8500 |
| M-1 (Comparison) | 50 | 50 | 0 | 8000 |
| B-5 (Comparison) | 49 | 48 | 3 | 8100 |

In Table 1, A to I given to the resins correspond to the specific examples of the alkali-soluble resins (ii), respectively.

EXAMPLES 1 TO 18

COMPARATIVE EXAMPLES 1 AND 2

1.4 g of each of the resins shown in Table 1, which were synthesized above, 0.18 g of a photo-acid generator and 10 mg of 1,5-diazabicyclo[4.3.0]-5-nonene (DBN) were compounded, and dissolved in propylene glycol monoethyl ether acetate containing 1% by weight of a surfactant, Florad FC430, so as to give a solid content of 14% by weight. Then, the resulting solution was filtered through a 0.1-μm microfilter to prepare a solution of a positive photoresist composition for far ultraviolet ray exposure.

In the following Table 2, PAG-1 indicates triphenylsulfonium triflate, and PAG-2 indicates (PAG4–35) synthesized above.

(Evaluation Tests)

The resulting positive photoresist composition solution was applied onto a silicon wafer with a spin coater, and dried at 140° C. for 90 seconds to prepare a positive photoresist film having a thickness of about 0.5 μm. which was exposed to an ArF excimer laser beam (wavelength: 193 nm, stepper of NA=0.55). After exposure, heat treatment was carried out at 120° C. for 90 seconds. Then, the photoresist film was developed with a 2.38% aqueous solution of tetramethylammonium hydroxide, and rinsed with distilled water to obtain a resist pattern profile.

For this, the defocus latitude depended on line pitch and the standard developing solution suitability were evaluated as shown below.

Defocus Latitude Depended on Line Pitch

In a line and space pattern (dense pattern) having a line width of 0.22 μm and an isolated pattern (coarse pattern), the overlapping range of focal allowance allowing 0.22 μm ±10% was determined. The larger range shows the better defocus latitude depended on line pitch. Results thereof are shown in Table 2.

TABLE 2

| | Resin | Photo Acid Generator | Defocus Latitude Depended on Line Pitch (μm) |
|---|---|---|---|
| Examples | | | |
| 1 | A-1 | PAG-1 | 0.8 |
| 2 | A-2 | PAG-2 | 0.9 |
| 3 | B-1 | PAG-2 | 1.0 |
| 4 | B-2 | PAG-1 | 0.9 |
| 5 | C-1 | PAG-1 | 1.1 |
| 6 | C-2 | PAG-2 | 1.1 |
| 7 | D-1 | PAG-1 | 1.1 |
| 8 | D-2 | PAG-2 | 1.1 |
| 9 | E-1 | PAG-1 | 0.8 |
| 10 | E-2 | PAG-1 | 0.8 |
| 11 | F-1 | PAG-2 | 0.8 |
| 12 | F-2 | PAG-1 | 0.8 |
| 13 | G-1 | PAG-2 | 0.8 |
| 14 | G-2 | PAG-1 | 0.8 |
| 15 | H-1 | PAG-2 | 0.9 |
| 16 | H-2 | PAG-1 | 1.0 |
| 17 | I-1 | PAG-1 | 1.1 |
| 18 | I-2 | PAG-2 | 1.1 |
| 19 | B-3 | PAG-1 | 0.6 |
| 20 | B-4 | PAG-1 | 0.7 |
| Comparative Examples | | | |
| 1 | M-1 | PAG-1 | 0.2 |
| 2 | B-5 | PAG-1 | 0.3 |

Standard Developing Solution Suitability

This was evaluated by the amount of film reduction in a non-exposed area of the resist pattern profile obtained above. A reduction of 10% or more in the film thickness was evaluated as "B", and the others as "A". Consequently, all were evaluated as "A" to give a good result.

As apparent from the results, the positive photoresist compositions of Comparative Examples were inferior in defocus latitude depended on line pitch. On the other hand, the positive photoresist compositions of the present invention were at the satisfactory level in terms of defocus latitude depended on line pitch and standard developing solution suitability. That is to say, they are suitable for lithography using far ultraviolet rays including ArF excimer laser exposure.

The positive photoresist compositions for far ultraviolet ray exposure of the present invention are sufficiently suitable, particularly, for light in the wavelength region of 170 nm to 220 nm, are good in defocus latitude depended on line pitch and standard developing solution suitability, have excellent sensitivity, and further have a few development defects, thus giving good resist pattern profiles.

While the invention has been described in detail and with reference to specific embodiments thereof, it will be apparent to one skilled in the art that various changes and modifications can be made therein without departing from the spirit and scope thereof.

What is claimed is:

1. A positive photoresist composition for far ultraviolet ray exposure comprising (i) a compound capable of generating an acid by irradiation of actinic light or radiation; and (ii) a resin containing
  (a) repeating units each having an alkali-soluble group protected with at least one of groups containing alicyclic hydrocarbon structures represented by the following general formulas (pI) to (pVI),
  (b) repeating units represented by the following general formula (rI) and
  (c) repeating units represented by the following general formula (sI), the content of said repeating units of (c) being from 5 mol % to 18 mol % based on the total repeating units of the resin, and said resin being decomposable by action of an acid to increase its solubility in an alkali solution:

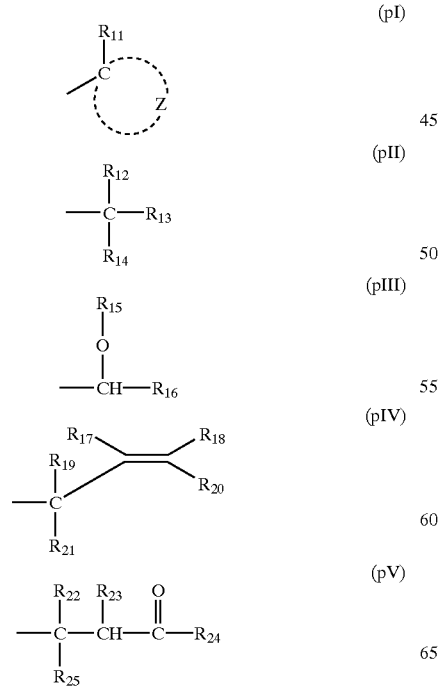

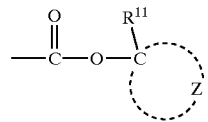

wherein $R_{11}$ represents a methyl group, an ethyl group, a n-propyl group, an isopropyl group, a n-butyl group, an isobutyl group or a sec-butyl group; Z represents an atomic group necessary for formation of an alicyclic hydrocarbon group together with the carbon atom present in formula (pI) or (pVI); $R_{12}$ to $R_{16}$ each independently represents a straight-chain or branched alkyl group having 1 to 4 carbon atoms or an alicyclic hydrocarbon group, with the proviso that at least one of $R_{12}$ to $R_{14}$ or either of $R_{15}$ and $R_{16}$ represents an alicyclic hydrocarbon group; $R_{17}$ to $R_{21}$ each independently represents a hydrogen atom, or a straight-chain or branched alkyl group having 1 to 4 carbon atoms or an alicyclic hydrocarbon group, with the proviso that at least one of $R_{17}$ to $R_{21}$ represents an alicyclic hydrocarbon group, and that either of $R_{19}$ and $R_{21}$ represents a straight-chain or branched alkyl group having 1 to 4 carbon atoms or an alicyclic hydrocarbon group; and $R_{22}$ to $R_{25}$ each independently represents a straight-chain or branched alkyl group having 1 to 4 carbon atoms or an alicyclic hydrocarbon group, with the proviso that at least one of $R_{22}$ to $R_{25}$ represents an alicyclic hydrocarbon group;

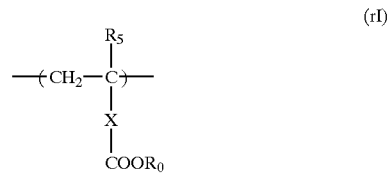

wherein $R_5$ represents a hydrogen atom, a halogen atom or a straight-chain or branched alkyl group having 1 to 4 carbon atoms; X represents a divalent connecting group; and $R_0$ represents

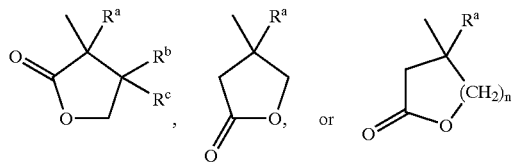

wherein $R^a$, $R^b$, and $R^c$ each represents a hydrogen atom or a straight-chain or branched alkyl group having from 1 to 4 carbon atoms, which may have a substituent, and n is an integer of 2 to 4;

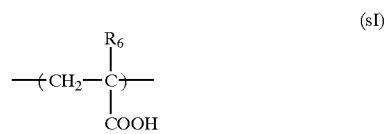

wherein $R_6$ represents a hydrogen atom, a halogen atom or a straight-chain or branched alkyl group having 1 to 4 carbon atoms.

2. The positive photoresist composition according to claim 1, which contains (iii) an amine compound.

3. The positive photoresist composition according to claim 2, which contains (iv) a surfactant.

4. The positive photoresist composition according to claim 3, wherein the content of the repeating units represented by formula (sI) is from 10 to 18 mol % of the total repeating units of the resin.

5. The positive photoresist composition according to claim 2, wherein the content of the repeating units represented by formula (sI) is from 10 to 18 mol % of the total repeating units of the resin.

6. The positive photoresist composition according to claim 1, which contains (iv) a surfactant.

7. The positive photoresist composition according to claim 6, wherein the content of the repeating units represented by formula (sI) is from 10 to 18 mol % of the total repeating units of the resin.

8. The positive photoresist composition according to claim 1, wherein the content of the repeating units represented by formula (sI) is from 10 to 18 mol % of the total repeating units of the resin.

9. The positive photoresist composition according to claim 1, wherein X represents —COO—A—, wherein A represents an alkylene group.

10. The positive photoresist composition according to claim 1, wherein said alicyclic hydrocarbon structure is represented by formula (pI).

11. The positive photoresist composition according to claim 1, wherein said alicyclic hydrocarbon structure is represented by formula (pII).

12. The positive photoresist composition according to claim 1, wherein said alicyclic hydrocarbon structure is represented by formula (pIII).

13. The positive photoresist composition according to claim 1, wherein said alicyclic hydrocarbon structure is represented by formula (pIV).

14. The positive photoresist composition according to claim 1, wherein said alicyclic hydrocarbon structure is represented by formula (pV).

15. The positive photoresist composition according to claim 1, wherein said alicyclic hydrocarbon structure is represented by formula (pVI).

\* \* \* \* \*